US012740154B2

(12) United States Patent
Kao et al.

(10) Patent No.: US 12,740,154 B2
(45) Date of Patent: Sep. 15, 2026

(54) BACK-END-OF-LINE CMOS INVERTER WITH VERTICAL CHANNELS AND METHODS OF FORMING THE SAME

(71) Applicant: Taiwan Semiconductor Manufacturing Company Limited, Hsinchu (TW)

(72) Inventors: Yun-Feng Kao, New Taipei City (TW); Katherine H. Chiang, New Taipei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 557 days.

(21) Appl. No.: 18/321,088

(22) Filed: May 22, 2023

(65) Prior Publication Data

US 2024/0395824 A1 Nov. 28, 2024

(51) Int. Cl.
*H10D 87/00* (2026.01)
*H10D 86/01* (2026.01)

(52) U.S. Cl.
CPC ............ *H10D 87/00* (2025.01); *H10D 86/01* (2025.01)

(58) Field of Classification Search
CPC .. H10D 30/673; H10D 30/6757; H10D 88/00; H10D 84/08; H10D 30/6755; H10D 87/00; H10D 86/01; H10D 86/411; H10D 86/423; H10D 88/01
See application file for complete search history.

(56) References Cited

U.S. PATENT DOCUMENTS

2008/0001184 A1* 1/2008 Genrikh ............. H10D 30/0512 257/256
2013/0168771 A1* 7/2013 Wu ...................... H10D 86/215 257/E21.632
2015/0311341 A1* 10/2015 Hur .................. H01L 21/02532 257/190
2016/0225676 A1* 8/2016 Jacob .................. H10D 30/024
2019/0326300 A1* 10/2019 Liaw .................... H10D 62/292
2020/0006149 A1* 1/2020 Liaw ................... H01L 21/3086
2021/0288158 A1* 9/2021 Shimizu ................ B60L 15/007

OTHER PUBLICATIONS

Jianq Chyun Intellectual Property Office; TW Application No. 112125855; Office Action mailed Mar. 18, 2025; 12 pages.
Hong Xiao, “Introduction to Semiconductor Manufacturing, second edition”, Library of Congress Cataloging-in- Publication Data, Spie Press, Washington, US, (2012) 15 pages.

* cited by examiner

*Primary Examiner* — Galina G Yushina
(74) *Attorney, Agent, or Firm* — The Marbury Law Group, PLLC

(57) ABSTRACT

A method of forming a semiconductor circuit includes forming an electrically insulating structure having a slab geometry including a first surface and a second surface that are parallel to one another and that are each oriented in respective planes that are perpendicular to a thickness direction. A p-type semiconductor layer is formed on the first surface, an n-type semiconductor layer is formed on the second surface, a gate dielectric layer formed is in contact with the p-type semiconductor layer and the n-type semiconductor layer, a gate electrode is formed in contact with the gate dielectric layer, a first source electrode and a first drain electrode are formed in contact with the p-type semiconductor layer, and a second source electrode and a second drain electrode are formed in contact with the n-type semiconductor layer.

20 Claims, 27 Drawing Sheets

200c
VDD
$V_{out}$
$V_{in}$
208
110a
112a
214
112b
110b
216
116
212
218
210
200
GND
VDD
206b
202
206a
118
112a
204b
204a
x
y
z 500
302
306
306
A'
A
x
y 500
306
204b
306
204b
202
204a
202
204a
302
x
z 600
206La
A'
A
y
x 600
306
206La
302
202
306
206La
202
z
x

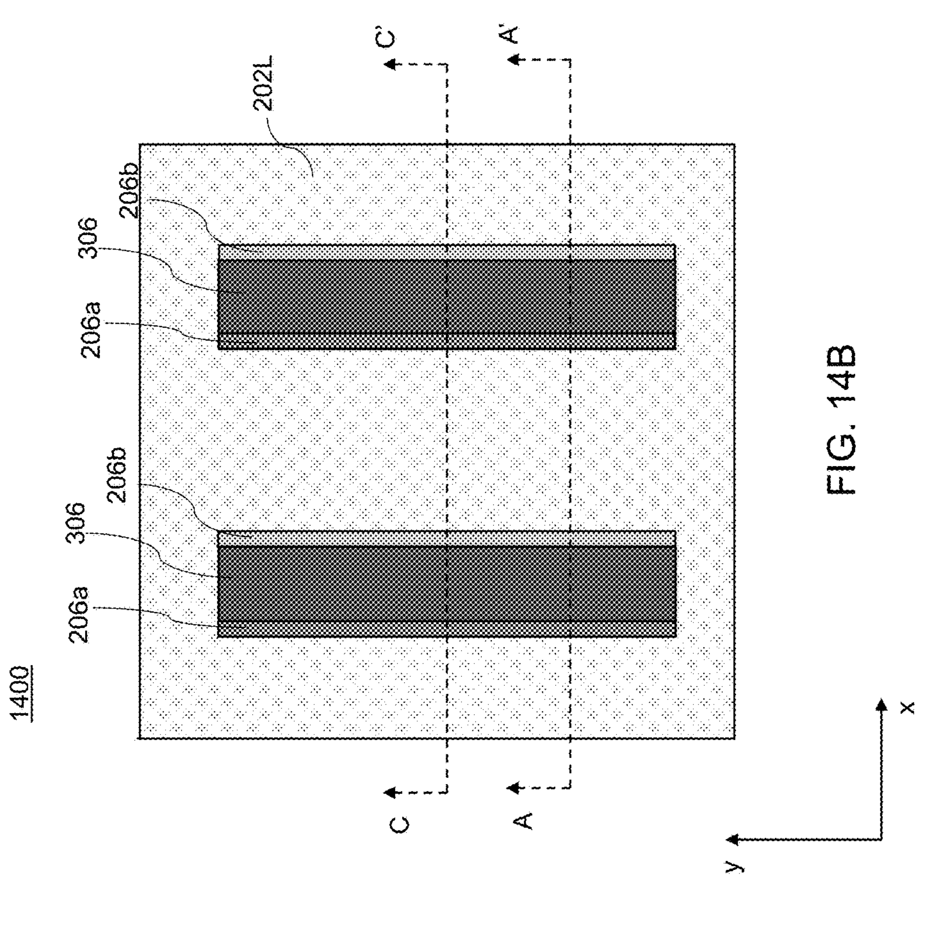
FIG. 14B
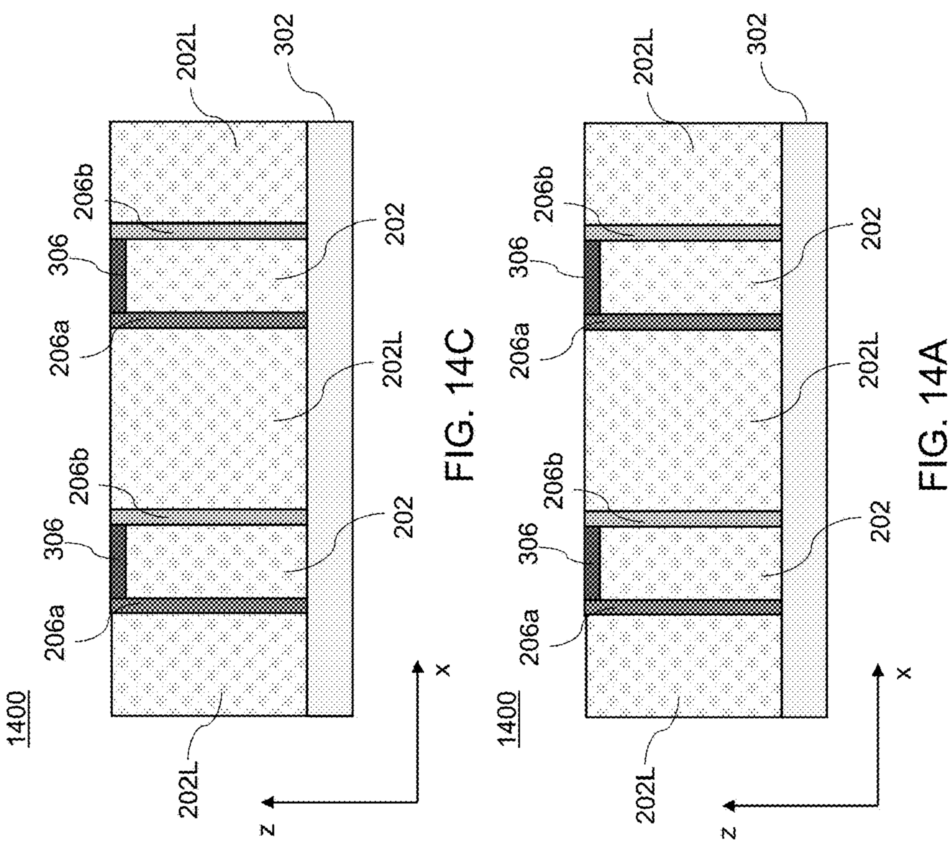
FIG. 14C
FIG. 14A

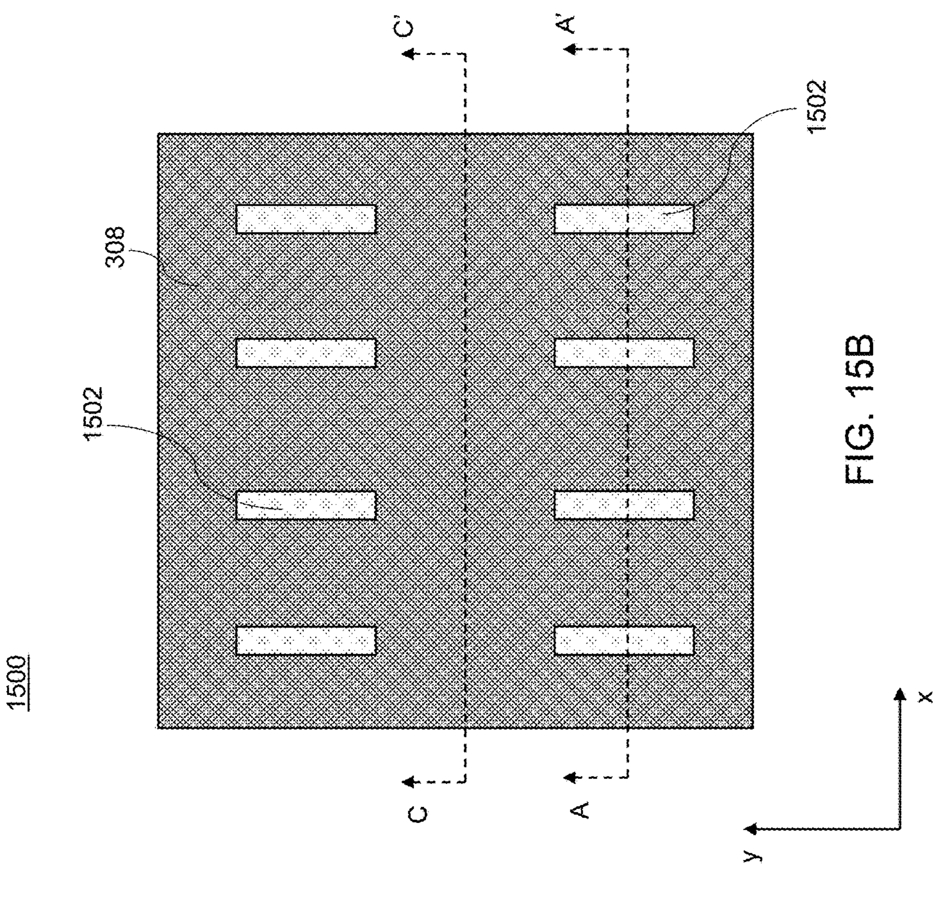
FIG. 15B
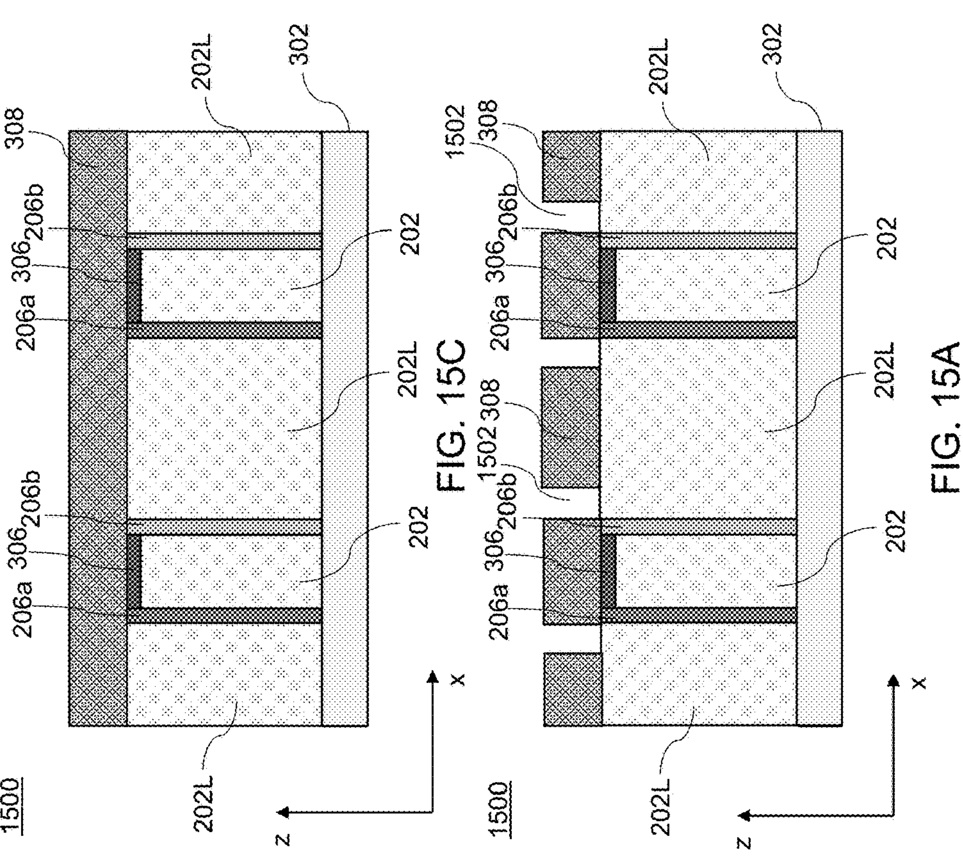
FIG. 15C
FIG. 15A

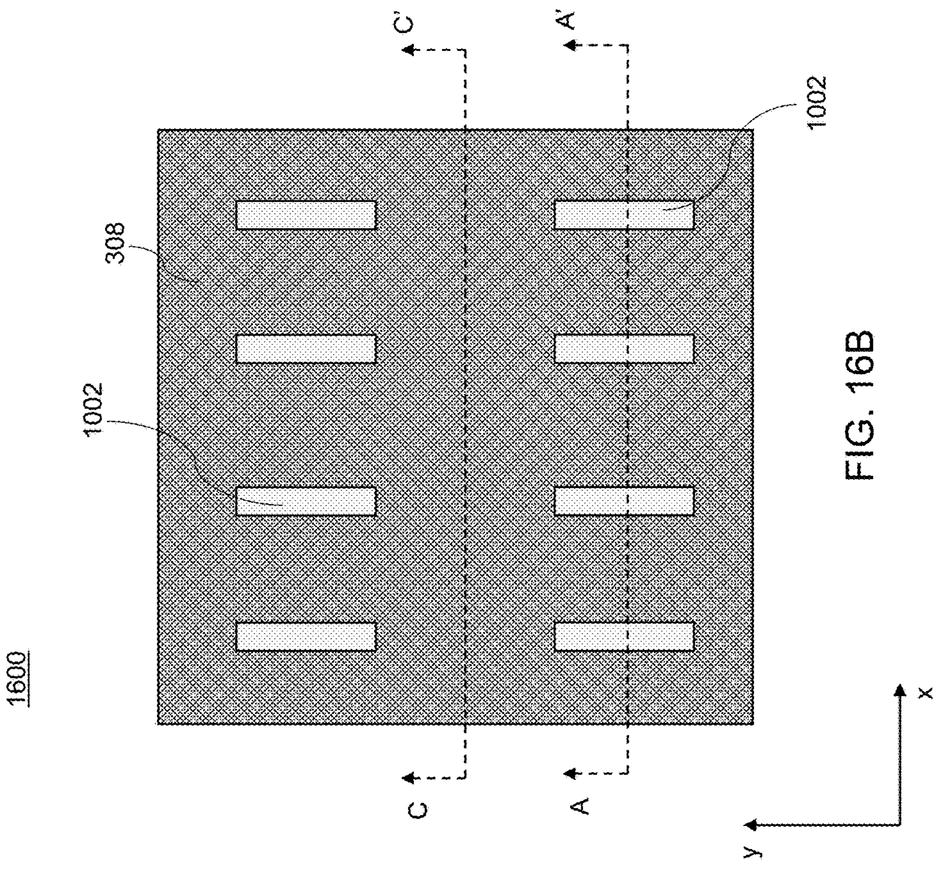
FIG. 16B
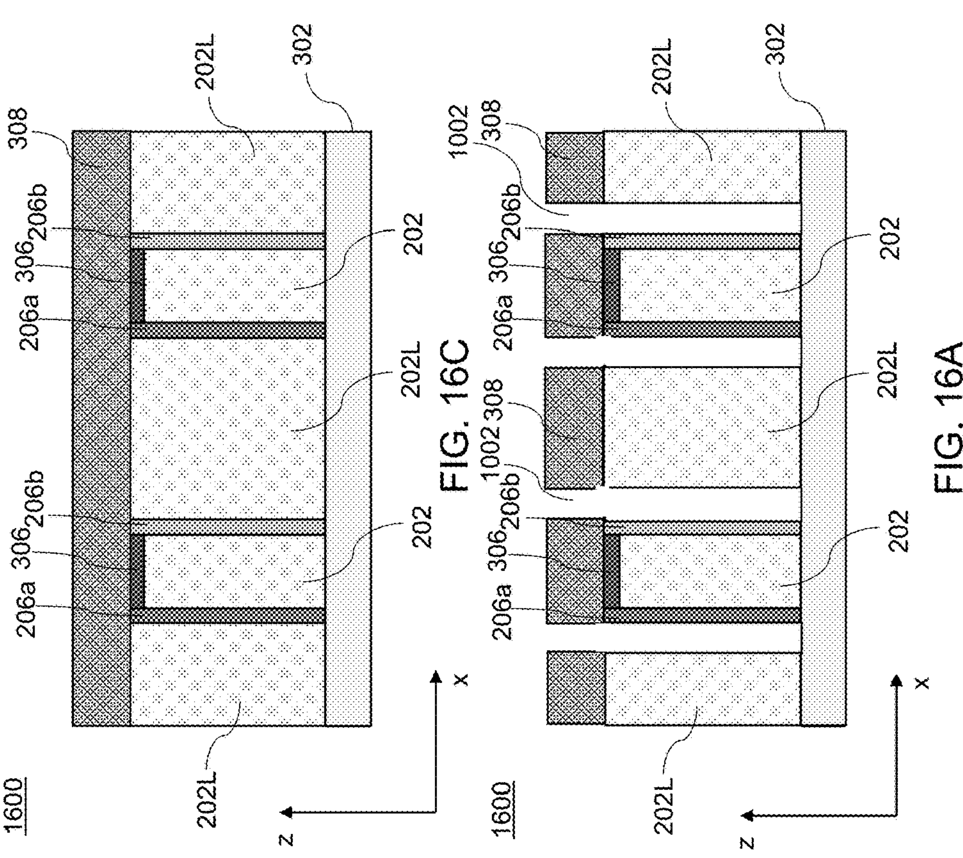
FIG. 16C
FIG. 16A

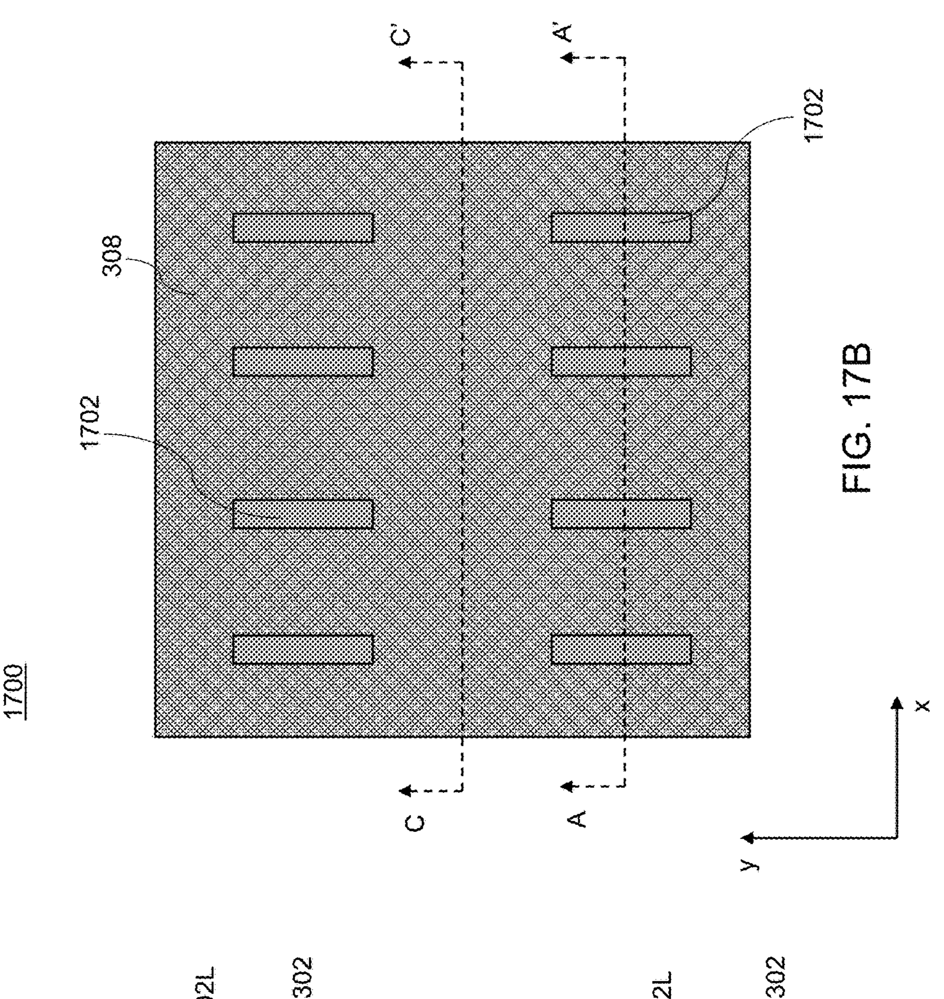
FIG. 17B
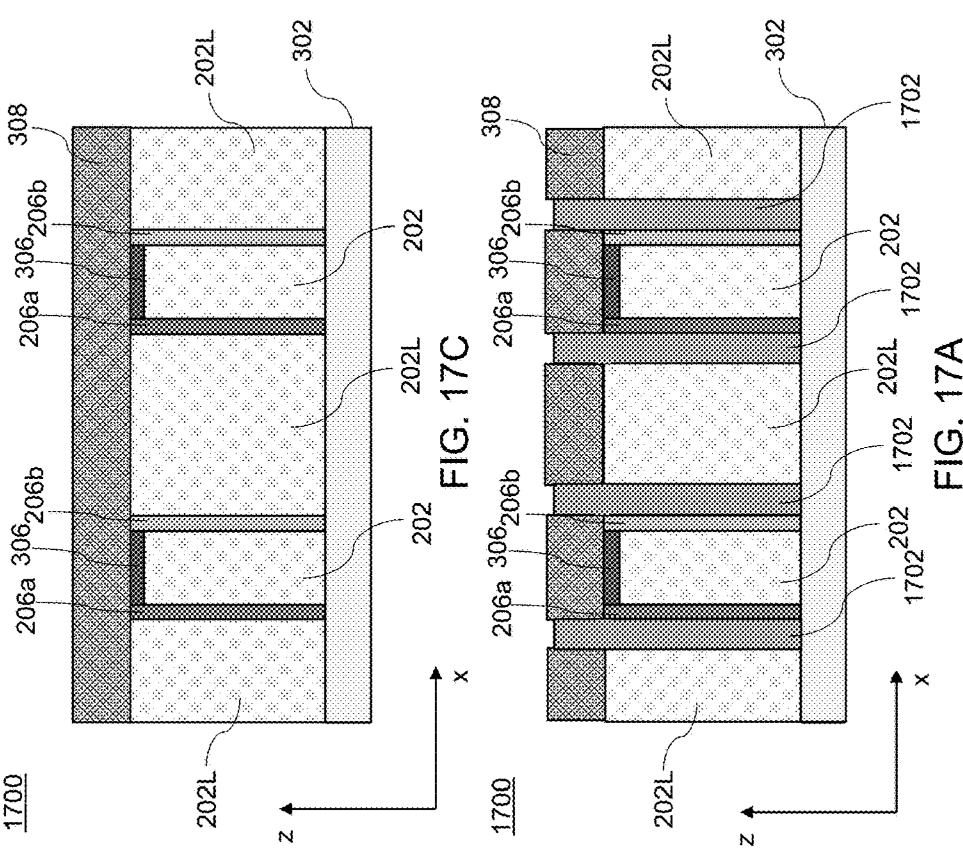
FIG. 17C
FIG. 17A

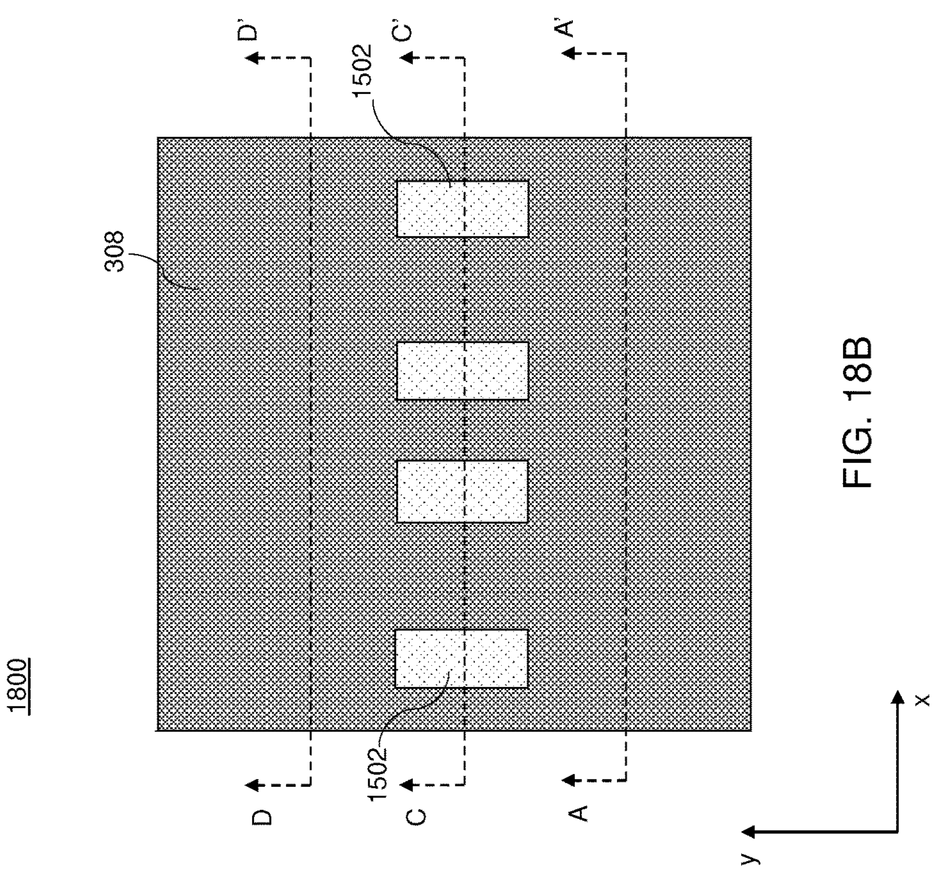
FIG. 18B
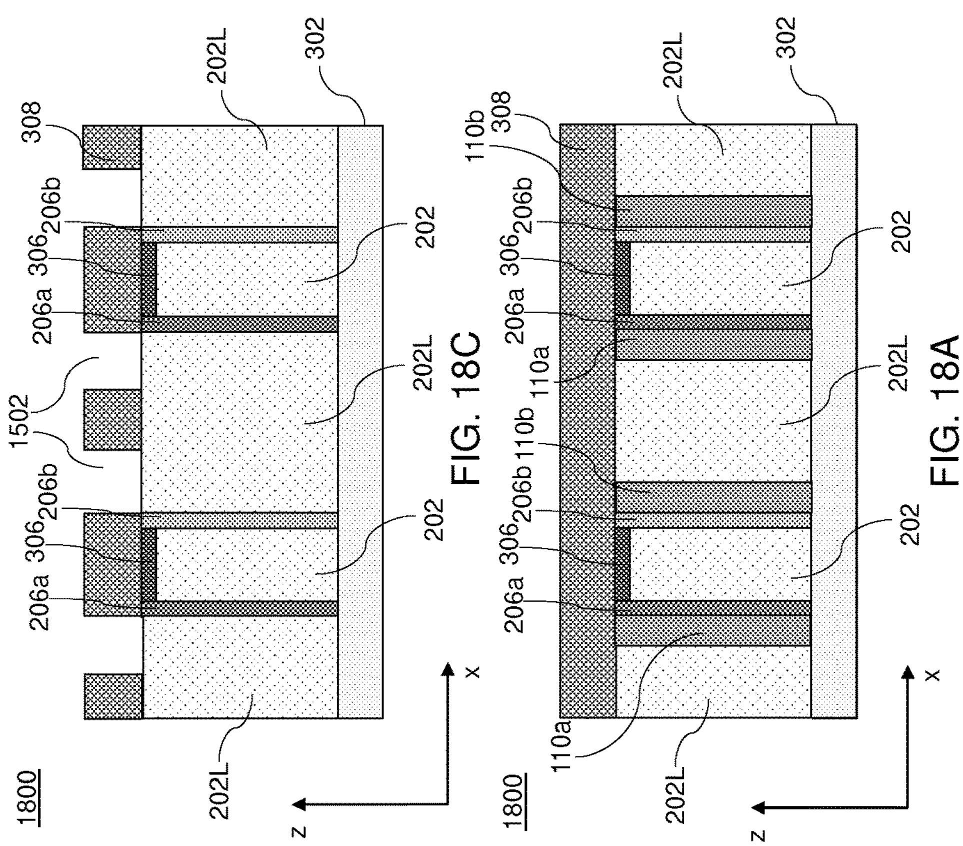
FIG. 18C
FIG. 18A

1800
D
D'
202L
302
308
112b
206b
306
206a
112a
202

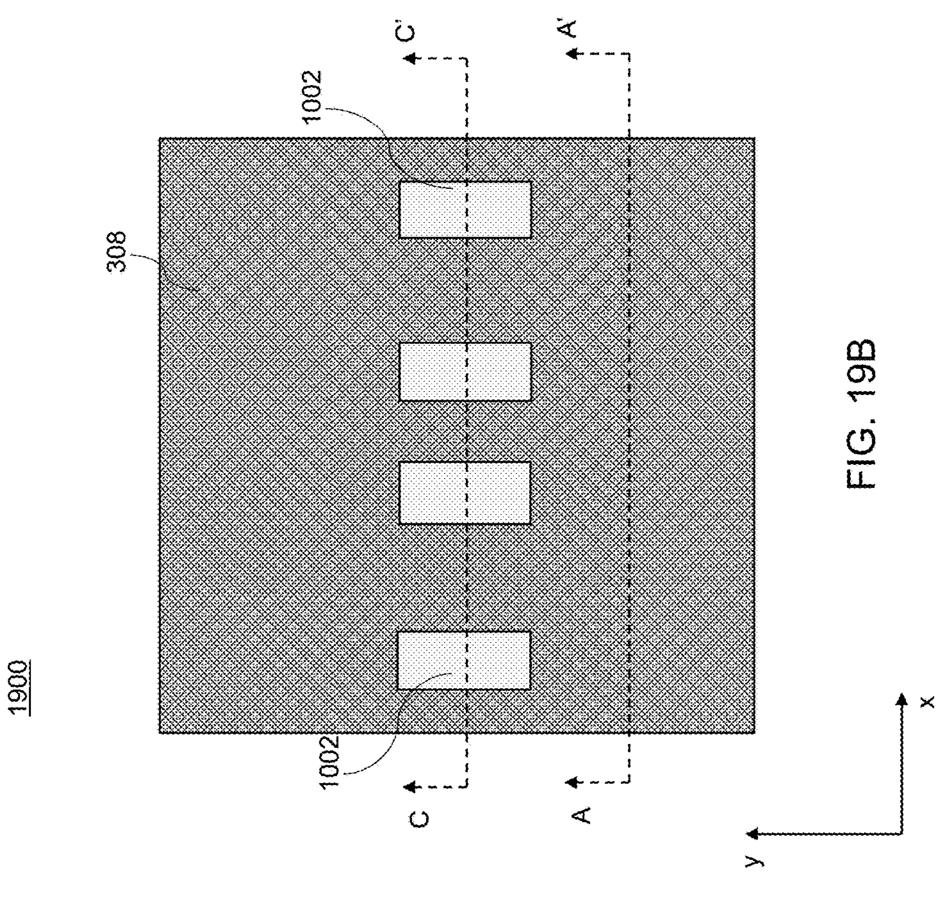
FIG. 19B
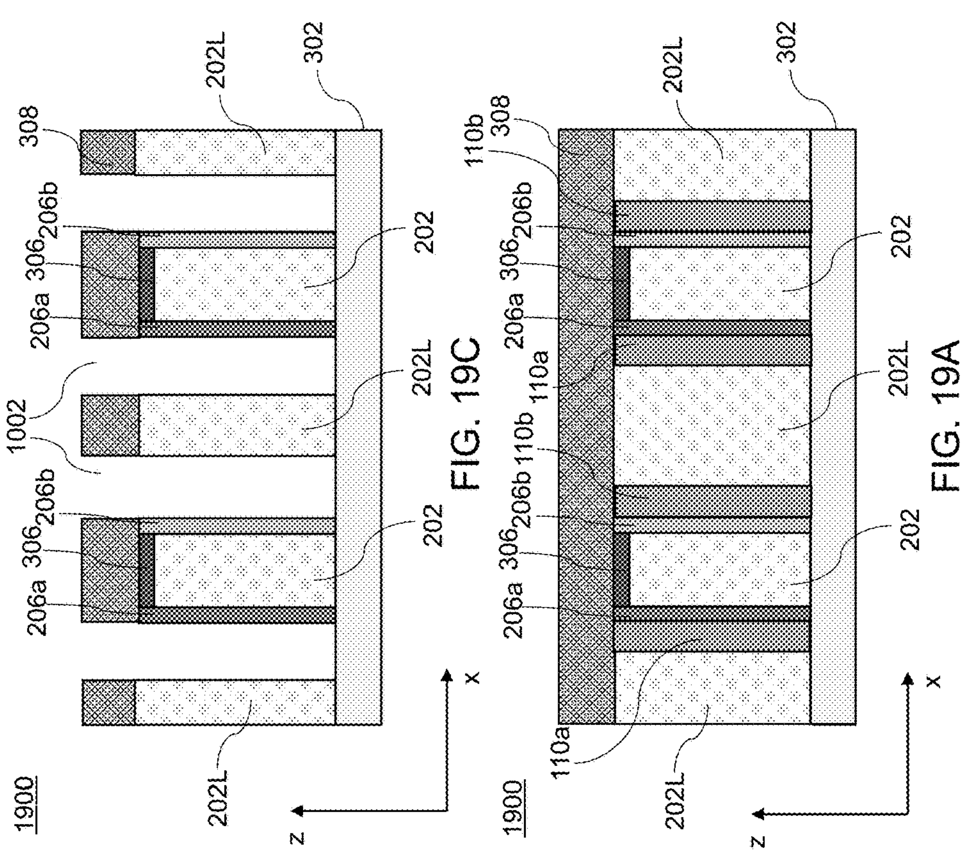
FIG. 19C
FIG. 19A

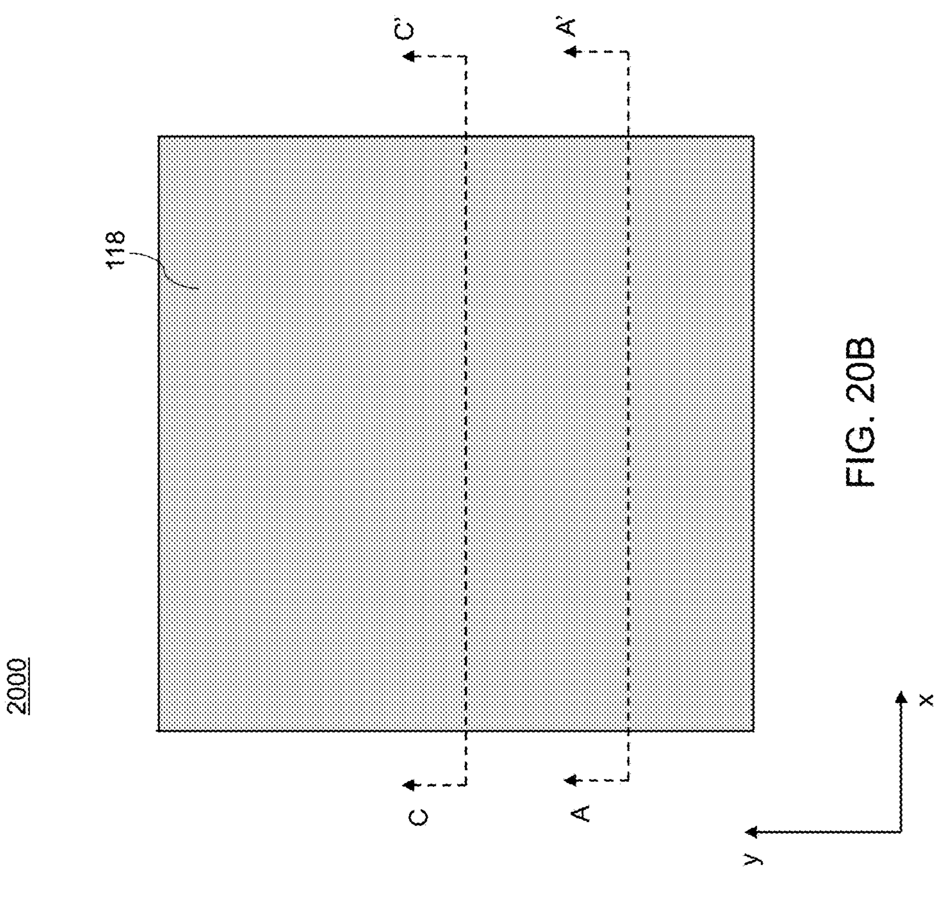
FIG. 20B
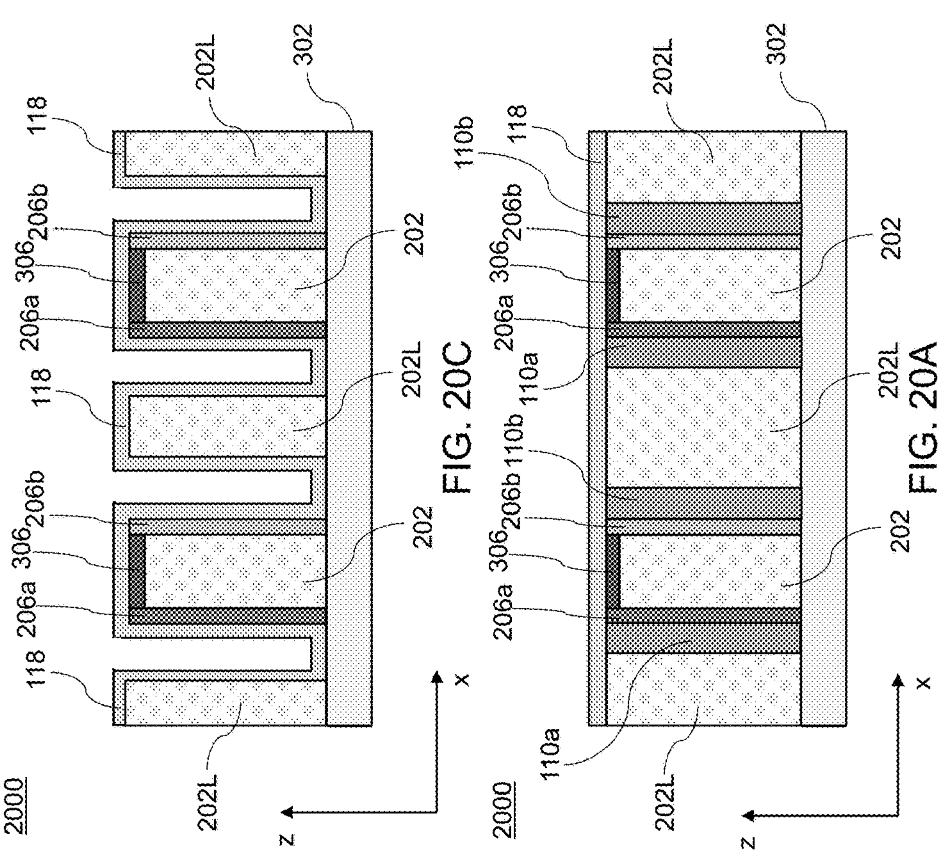
FIG. 20C
FIG. 20A

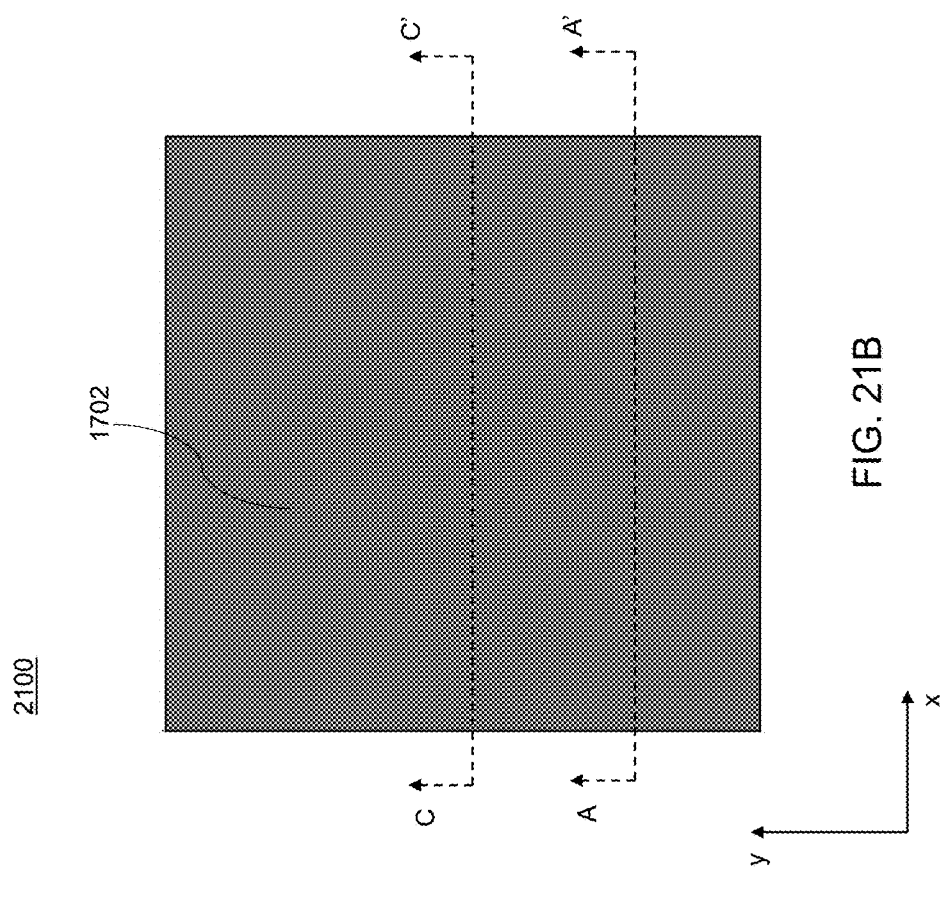
FIG. 21B
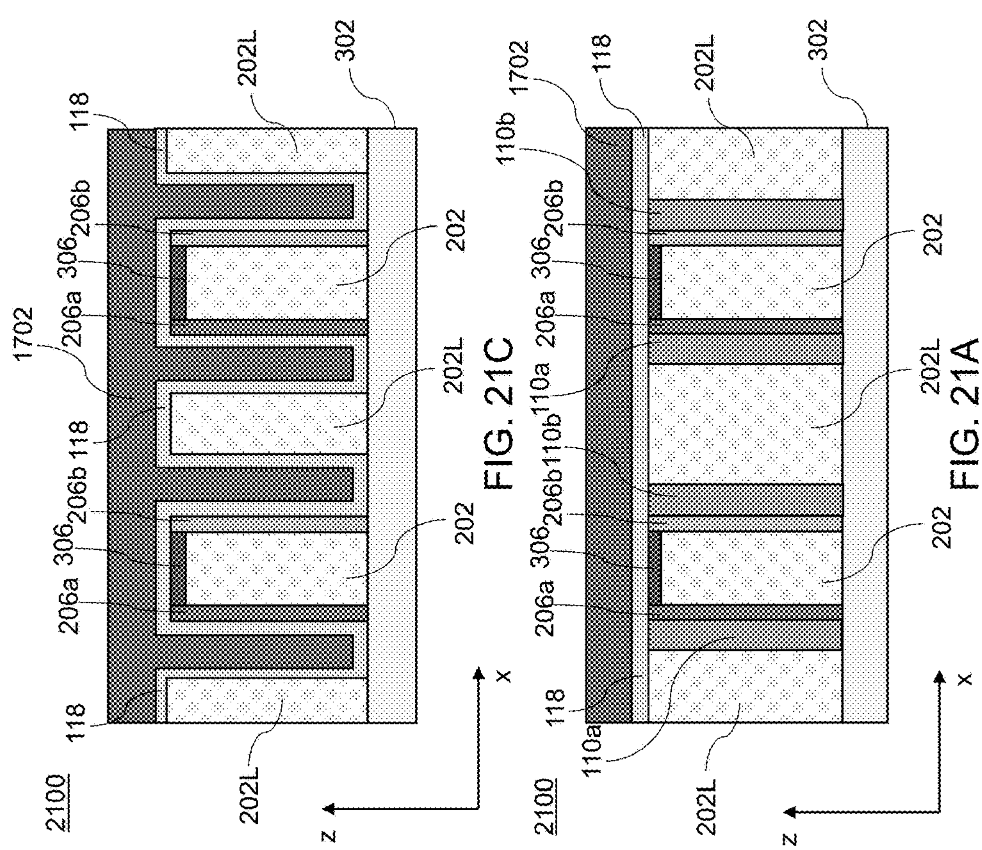
FIG. 21C
FIG. 21A 2200
308
1702
308
C
C'
A
A'
x
y 2200
308
118
206a
306
206b
1702
202L
202
302
x
z 2200
110a
118
206a
306
206b
110b
1702
202L
202
302
x
z

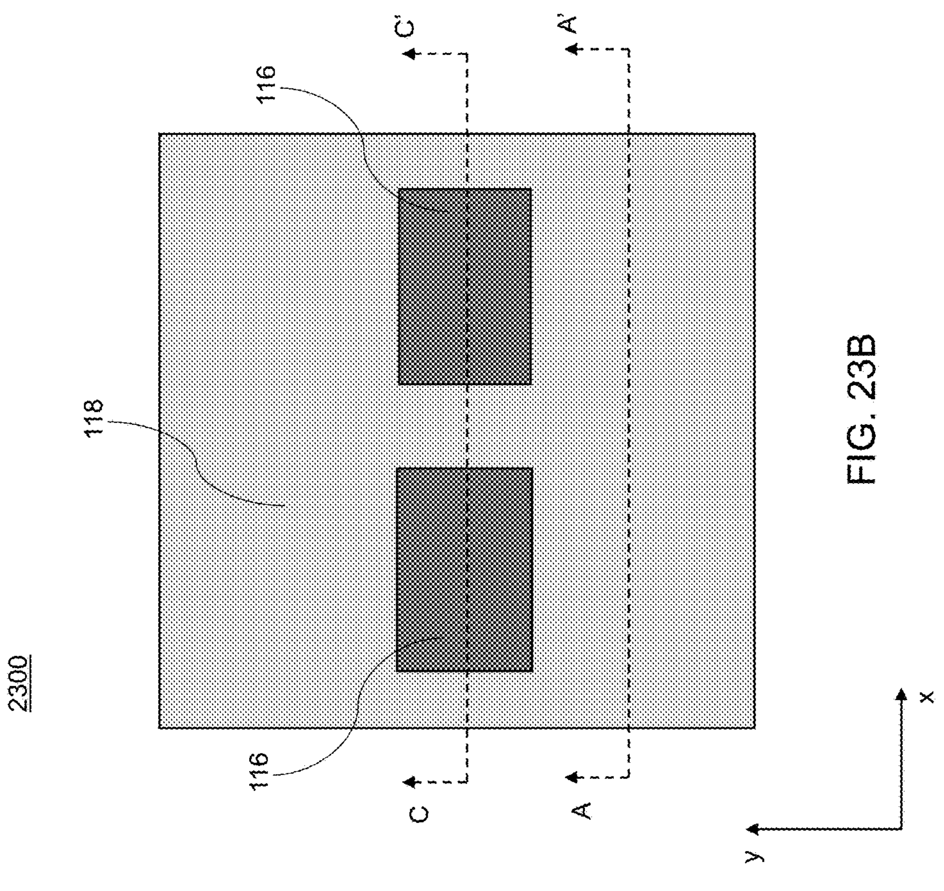
FIG. 23B
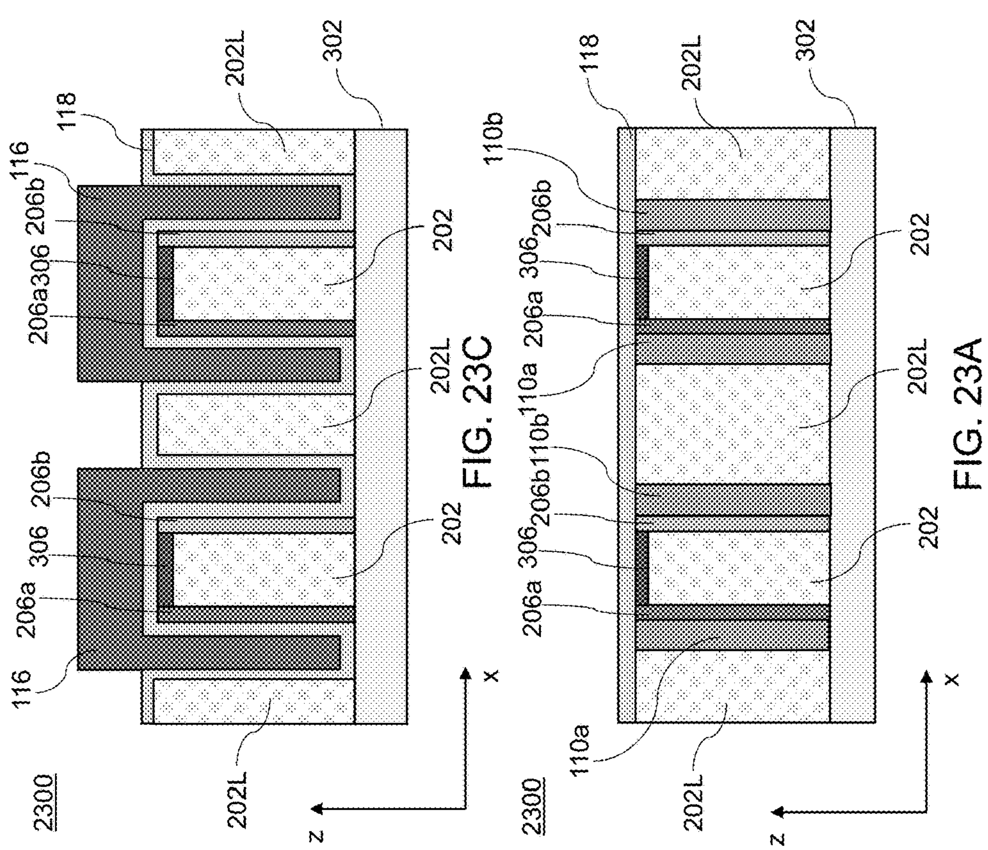
FIG. 23C
FIG. 23A 200
116
112b
118
110b
206b
206a
110a
202
C
A
x
y
z 200
202L
116
C'
A'
C
A
x
y 200
202L
116
118
206b
306
206a
202
302

200
110a
110b
118
206a
306
206b
202
202L
302

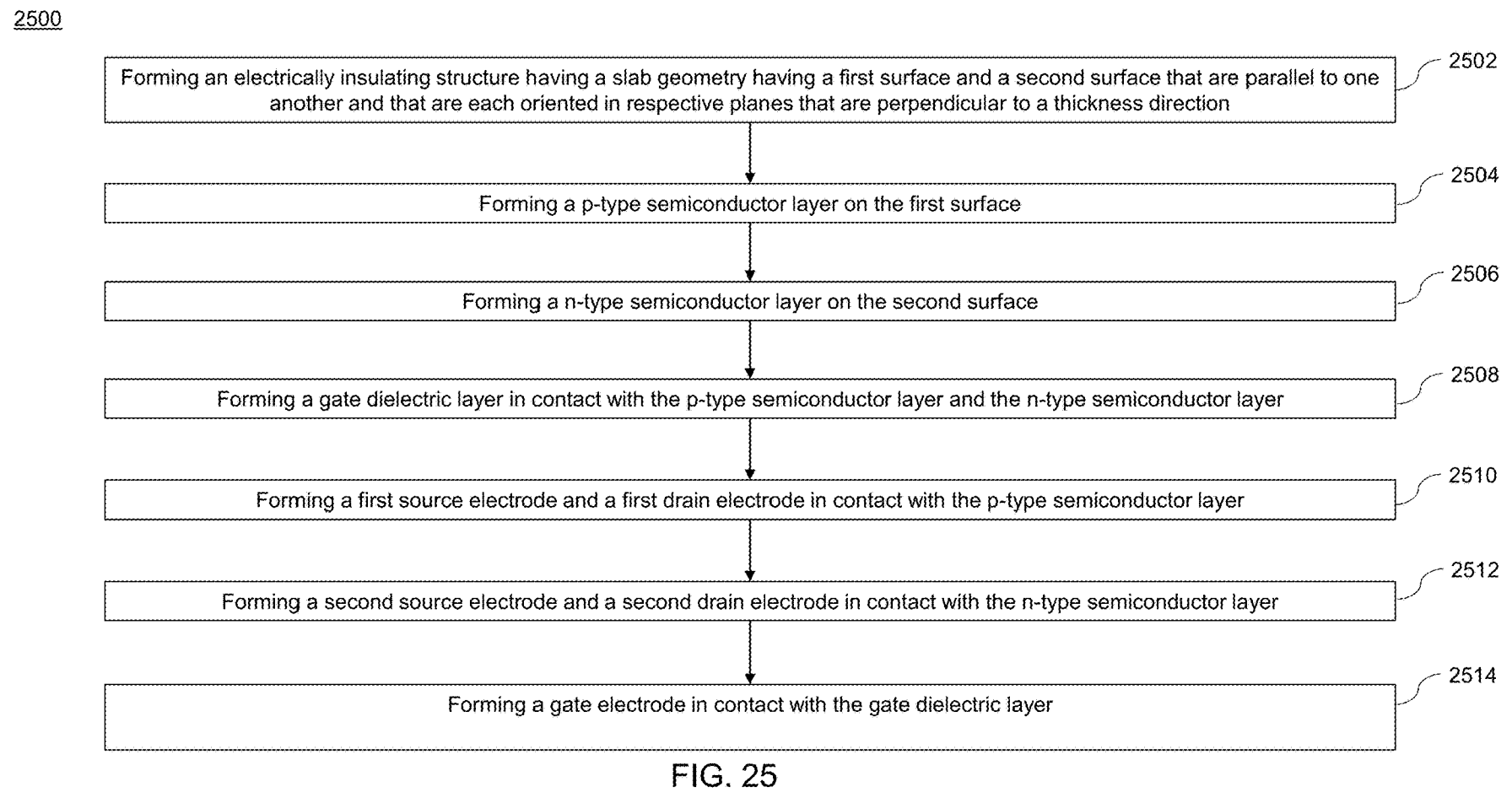

2500

2502 — Forming an electrically insulating structure having a slab geometry having a first surface and a second surface that are parallel to one another and that are each oriented in respective planes that are perpendicular to a thickness direction

↓

2504 — Forming a p-type semiconductor layer on the first surface

↓

2506 — Forming a n-type semiconductor layer on the second surface

↓

2508 — Forming a gate dielectric layer in contact with the p-type semiconductor layer and the n-type semiconductor layer

↓

2510 — Forming a first source electrode and a first drain electrode in contact with the p-type semiconductor layer

↓

2512 — Forming a second source electrode and a second drain electrode in contact with the n-type semiconductor layer

↓

2514 — Forming a gate electrode in contact with the gate dielectric layer

FIG. 25

BACK-END-OF-LINE CMOS INVERTER WITH VERTICAL CHANNELS AND METHODS OF FORMING THE SAME

BACKGROUND

The semiconductor industry has grown due to continuous improvements in integration density of various electronic components (e.g., transistors, diodes, resistors, inductors, capacitors, etc.). For the most part, these improvements in integration density have come from successive reductions in minimum feature size, which allow more components to be integrated into a given area. In this regard, individual transistors, interconnects, and related structures have become increasingly smaller and there is an ongoing need to develop new materials, processes, and designs of semiconductor devices and interconnects to allow further progress.

Transistors made of oxide semiconductors are an attractive option for back-end-of-line (BEOL) integration since such transistors may be processed at low temperatures and thus, may not damage previously fabricated devices. For example, the fabrication conditions and techniques may not damage previously fabricated front-end-of-line (FEOL) and middle end-of-line (MEOL) devices. Circuits based on oxide semiconductor-based transistor devices may further include other components that may be fabricated in a BEOL process, such as capacitors, inductors, resistors, and integrated passive devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14A is a vertical cross-sectional view of a further intermediate structure that may be used in the formation of a semiconductor circuit, according to various embodiments.

FIG. 14B is a top view of the intermediate structure of FIG. 14A, according to various embodiments.

FIG. 14C is a further vertical cross-sectional view of the intermediate structure of FIGS. 14A and 14B, according to various embodiments.

FIG. 15A is a vertical cross-sectional view of a further intermediate structure that may be used in the formation of a semiconductor circuit, according to various embodiments.

FIG. 15B is a top view of the intermediate structure of FIG. 15A, according to various embodiments.

FIG. 15C is a further vertical cross-sectional view of the intermediate structure of FIGS. 15A and 15B, according to various embodiments.

FIG. 16A is a vertical cross-sectional view of a further intermediate structure that may be used in the formation of a semiconductor circuit, according to various embodiments.

FIG. 16B is a top view of the intermediate structure of FIG. 16A, according to various embodiments.

FIG. 16C is a further vertical cross-sectional view of the intermediate structure of FIGS. 16A and 16B, according to various embodiments.

FIG. 17A is a vertical cross-sectional view of a further intermediate structure that may be used in the formation of a semiconductor circuit, according to various embodiments.

FIG. 17B is a top view of the intermediate structure of FIG. 17A, according to various embodiments.

FIG. 17C is a further vertical cross-sectional view of the intermediate structure of FIGS. 17A and 17B, according to various embodiments.

FIG. 18A is a vertical cross-sectional view of a further intermediate structure that may be used in the formation of a semiconductor circuit, according to various embodiments.

FIG. 18B is a top view of the intermediate structure of FIG. 18A, according to various embodiments.

FIGS. 18C and 18D are further vertical cross-sectional views of the intermediate structure of FIGS. 18A and 18B, according to various embodiments.

FIG. 19A is a vertical cross-sectional view of a further intermediate structure that may be used in the formation of a semiconductor circuit, according to various embodiments.

FIG. 19B is a top view of the intermediate structure of FIG. 19A, according to various embodiments.

FIG. 19C is a further vertical cross-sectional view of the intermediate structure of FIGS. 19A and 19B, according to various embodiments.

FIG. 20A is a vertical cross-sectional view of a further intermediate structure that may be used in the formation of a semiconductor circuit, according to various embodiments.

FIG. 20B is a top view of the intermediate structure of FIG. 20A, according to various embodiments.

FIG. 20C is a further vertical cross-sectional view of the intermediate structure of FIGS. 20A and 20B, according to various embodiments.

FIG. 21A is a vertical cross-sectional view of a further intermediate structure that may be used in the formation of a semiconductor circuit, according to various embodiments.

FIG. 21B is a top view of the intermediate structure of FIG. 21A, according to various embodiments.

FIG. 21C is a further vertical cross-sectional view of the intermediate structure of FIGS. 21A and 21B, according to various embodiments.

FIG. 23A is a vertical cross-sectional view of a further intermediate structure that may be used in the formation of a semiconductor circuit, according to various embodiments.

FIG. 23B is a top view of the intermediate structure of FIG. 23A, according to various embodiments.

FIG. 23C is a further vertical cross-sectional view of the intermediate structure of FIGS. 23A and 23B, according to various embodiments.

FIG. 25 is a flowchart illustrating operations of a method of forming a semiconductor circuit, according to various embodiments.

DETAILED DESCRIPTION

Figure 1:
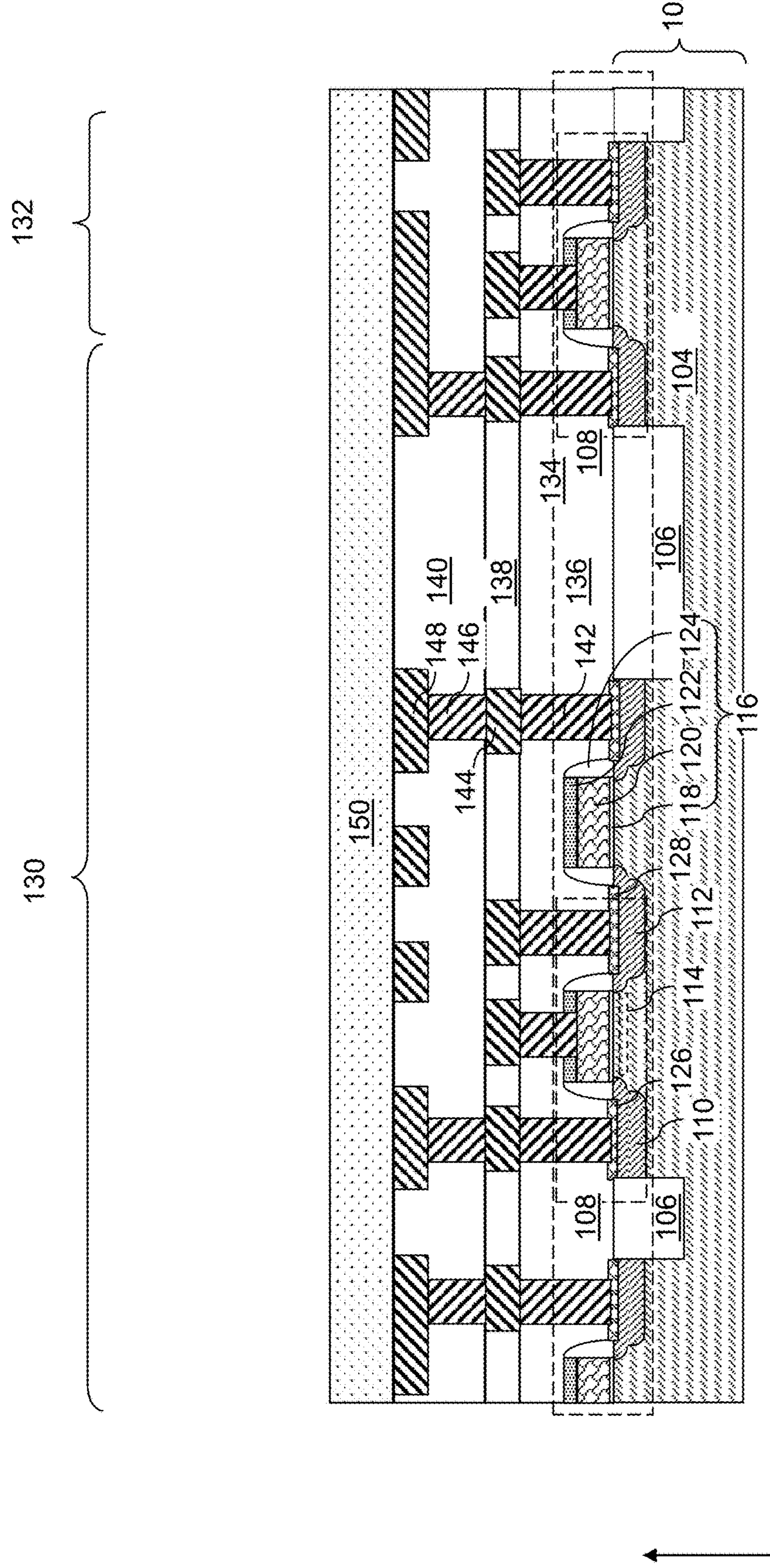
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer, according to various embodiments.

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments of this disclosure provide semiconductor circuits and methods that may be advantageous in terms of manufacturing flexibility, reduced size, and reduced short channel effects. In this regard, an embodiment semiconductor circuit (e.g., a CMOS inverter) is provided that may be formed in a BEOL process and may be incorporated with other BEOL circuit components such as capacitors, inductors, resistors, and integrated passive devices. As such, the disclosed semiconductor circuit may include materials that may be processed at low temperatures and thus, may not damage previously fabricated devices (e.g., FEOL and MEOL devices). Further, various embodiment semiconductor circuits may include a p-channel metal oxide semiconductor field effect transistor (pFET) having a vertical channel layer and an n-channel metal oxide semiconductor field effect transistor (nFET) also having a vertical channel layer. Each of the vertical p-channel and the vertical n-channel may be formed on opposite sides of a vertically-oriented electrically insulating structure such that the vertical p-channel and the vertical n-channel are closely spaced relative to one another. The use of such vertical channels may provide a semiconductor circuit having a reduced size relative to alternative structures that do not include vertical channels and may allow longer channel lengths without increased device size, which may mitigate short-channel effects.

An embodiment inverter circuit includes an electrically insulating structure having a slab geometry comprising a first surface and a second surface that are parallel to one another. The first surface and the second surface may be each oriented in respective planes that are perpendicular to a thickness direction. The embodiment inverter circuit may include a p-type semiconductor layer formed on the first surface, an n-type semiconductor layer formed on the second surface, a gate dielectric layer formed in contact with the p-type semiconductor layer and the n-type semiconductor layer, a gate electrode formed in contact with the gate dielectric layer, a first source electrode and a first drain electrode formed in contact with the p-type semiconductor layer, and a second source electrode and a second drain electrode formed in contact with the n-type semiconductor layer. The inverter circuit may be connected to a voltage supply, a ground voltage terminal, an input signal terminal, and an output terminal to operate as an inverter.

In a further embodiment, a semiconductor circuit may include a first layer of a p-type metal-oxide semiconductor formed along a first vertical plane within an interlayer dielectric layer relative to a horizontal interface of the interlayer dielectric layer and a second layer of an n-type metal-oxide semiconductor formed along a second vertical plane within the interlayer dielectric layer relative to the horizontal interface of the interlayer dielectric layer such that the first layer and the second layer are parallel to one another and are separated from one another by a portion of the interlayer dielectric layer. The semiconductor circuit may further include a gate electrode having a first vertical portion parallel to the first layer and a second vertical portion parallel to the second layer, a gate dielectric layer separating the first vertical portion of the gate electrode from the first layer and also separating the second vertical portion of the gate electrode from the second layer, a first source electrode and a first drain electrode formed in contact with the p-type metal-oxide semiconductor, and a second source electrode and a second drain electrode formed in contact with the n-type metal-oxide semiconductor.

An embodiment method of forming a semiconductor circuit may include forming an electrically insulating structure having a slab geometry comprising a first surface and a second surface that are parallel to one another and that are each oriented in respective planes that are perpendicular to a thickness direction, forming a p-type semiconductor layer on the first surface, forming a n-type semiconductor layer on the second surface, forming a gate dielectric layer in contact with the p-type semiconductor layer and the n-type semiconductor layer, forming a gate electrode in contact with the gate dielectric layer, forming a first source electrode and a first drain electrode in contact with the p-type semiconductor layer, and forming a second source electrode and a second drain electrode in contact with the n-type semiconductor layer.

FIG. 1 illustrates a semiconductor structure 100, according to various embodiments. The semiconductor structure 100 includes a substrate 102, which may be a semiconductor substrate such as a commercially available silicon substrate. The substrate 102 may include a semiconductor material layer 104 or at least at an upper portion thereof. The semiconductor material layer 104 may be a surface portion of a bulk semiconductor substrate or may be a top semiconductor layer of a semiconductor-on-insulator (SOI) substrate. In one embodiment, the semiconductor material layer 104 includes a single crystalline semiconductor material such as single crystalline silicon. In one embodiment, the substrate 102 may include a single crystalline silicon substrate including a single crystalline silicon material.

Shallow trench isolation structures 106 including a dielectric material such as silicon oxide may be formed in an upper portion of the semiconductor material layer 104. Suitably doped semiconductor wells, such as p-type wells and n-type wells, may be formed within each area that is laterally enclosed by a portion of the shallow trench isolation structures 106. Field effect transistors 108 may be formed over a top surface of the semiconductor material layer 104. For example, each of the field effect transistors 108 may include a source electrode 110, a drain electrode 112, a semiconductor channel 114 that includes a surface portion of the substrate 102 extending between the source electrode 110 and the drain electrode 112, and a gate structure 116. The semiconductor channel 114 may include a single crystalline semiconductor material.

Each gate structure 116 may include a gate dielectric layer 118, a gate electrode 120, a gate cap dielectric 122, and a dielectric gate spacer 124. A source-side metal-semiconductor alloy region 126 may be formed on each source electrode 110, and a drain-side metal-semiconductor alloy region 128 may be formed on each drain electrode 112. The devices formed on the top surface of the semiconductor material layer 104 may include complementary metal-oxide-semiconductor (CMOS) transistors and optionally additional semiconductor devices (such as resistors, diodes, capacitors, etc.), and are collectively referred to as CMOS circuitry 134.

The semiconductor structure 100 of FIG. 1 may include a memory array region 130 in which an array of memory cells may be subsequently formed. The first exemplary structure may further include a peripheral region 132 in which metal wiring for the array of memory devices is provided. Generally, the field effect transistors 108 in the CMOS circuitry 134 may be electrically connected to an electrode of a respective memory cell by a respective set of metal interconnect structures.

Devices (such as field effect transistors 108) in the peripheral region 132 may provide functions that operate the array of memory cells to be subsequently formed. Specifically, devices in the peripheral region may be configured to control the programming operation, the erase operation, and the sensing (read) operation of the array of memory cells. For example, the devices in the peripheral region 132 may include a sensing circuitry and/or a programming circuitry.

One or more of the field effect transistors 108 in the CMOS circuitry 134 may include a semiconductor channel 114 that contains a portion of the semiconductor material layer 104 in the substrate 102. In embodiments in which the semiconductor material layer 104 includes a single crystalline semiconductor material such as single crystalline silicon, the semiconductor channel 114 of each of the field effect transistors 108 in the CMOS circuitry 134 may include a single crystalline semiconductor channel such as a single crystalline silicon channel. In one embodiment, a plurality of field effect transistors 108 in the CMOS circuitry 134 may include a respective node that is subsequently electrically connected to a node of a respective memory cell to be subsequently formed. For example, a plurality of field effect transistors 108 in the CMOS circuitry 134 may include a respective source electrode 110 or a respective drain electrode 112 that is subsequently electrically connected to a node of a respective memory cell to be subsequently formed.

In one embodiment, the CMOS circuitry 134 may include a programming control circuit configured to control gate voltages of a set of field effect transistors 108 that may be used for programming a respective memory cell (e.g., a ferroelectric memory cell) and to control gate voltages of transistors (e.g., thin-film transistors) to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 102 may include a single crystalline silicon substrate, and the field effect transistors 108 may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant.

According to an embodiment, the field effect transistors 108 may be subsequently electrically connected to drain electrodes and gate electrodes of access transistors including semiconducting metal oxide plates to be formed above the field effect transistors 108. In one embodiment, a subset of the field effect transistors 108 may be subsequently electrically connected to at least one of the drain electrodes and the gate electrodes. For example, the field effect transistors 108 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 108 may include bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 102 and the semiconductor devices thereupon (such as field effect transistors 108). In an illustrative example, the dielectric material layers may include, for example, a first dielectric material layer 136 that may be a layer that surrounds the contact structure connected to the source and drains (sometimes referred to as a contact-level dielectric material layer), a first interconnect-level dielectric material layer 138, and a second interconnect-level dielectric material layer 140. The metal interconnect structures may include device contact via structures 142 formed in the first dielectric material layer 136 and contacting a respective component of the CMOS circuitry 134, first metal line structures 144 formed in the first interconnect-level dielectric material layer 138, first metal via structures 146 formed in a lower portion of the second interconnect-level dielectric material layer 140, and second metal line structures 148 formed in an upper portion of the second interconnect-level dielectric material layer 140.

Each of the dielectric material layers (136, 138, 140) may include a dielectric material such as undoped silicate glass, a doped silicate glass, organosilicate glass, amorphous fluorinated carbon, porous variants thereof, or combinations thereof. Each of the metal interconnect structures (142, 144, 146, 148) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, TiN, alloys thereof, and/or combinations thereof.

Other suitable metallic liner and metallic fill materials within the contemplated scope of disclosure may also be used. In one embodiment, the first metal via structures 146 and the second metal line structures 148 may be formed as integrated line and via structures by a dual damascene process. The dielectric material layers (136, 138, 140) are herein referred to as lower-lower-level dielectric material layers. The metal interconnect structures (142, 144, 146, 148) formed within in the lower-level dielectric material layers are herein referred to as lower-level metal interconnect structures.

While the disclosure is described using an embodiment in which an array of memory cells may be formed over the second line-and-via-level dielectric material layer 140, embodiments are expressly contemplated herein in which the array of memory cells may be formed at a different metal interconnect level.

An array of thin-film transistors and an array of ferroelectric memory cells (or other types of memory cells) may be subsequently deposited over the dielectric material layers (136, 138, 140) that have formed therein the metal interconnect structures (142, 144, 146, 148). The set of all dielectric material layers that are formed prior to formation of an array of thin-film transistors or an array of ferroelectric memory cells is collectively referred to as lower-level dielectric material layers (136, 138, 140). The set of all metal interconnect structures that is formed within the lower-level dielectric material layers (136, 138, 140) is herein referred to as first metal interconnect structures (142, 144, 146, 148). Generally, first metal interconnect structures (142, 144, 146, 148) formed within at least one lower-level dielectric material layer (136, 138, 140) may be formed over the semiconductor material layer 104 that is located in the substrate 102.

According to an embodiment, thin-film transistors may be subsequently formed in a metal interconnect level that overlies that metal interconnect levels that contain the lower-level dielectric material layers (136, 138, 140) and the first metal interconnect structures (142, 144, 146, 148). In one embodiment, a planar dielectric material layer having a uniform thickness may be formed over the lower-level dielectric material layers (136, 138, 140). The planar dielectric material layer is herein referred to as an insulating matrix layer 150. The insulating matrix layer 150 may include a dielectric material such as undoped silicate glass, a doped silicate glass, organosilicate glass, or a porous dielectric material, and may be deposited by chemical vapor deposition. The thickness of the insulating matrix layer 150 may be in a range from 20 nm (i.e., 200 angstrom) to 300 nm (i.e., 3000 angstrom), although lesser and greater thicknesses may also be used.

Generally, interconnect-level dielectric layers (such as the lower-level dielectric material layer (136, 138, 140)) containing therein the metal interconnect structures (such as the first metal interconnect structures (142, 144, 146, 148)) may be formed over semiconductor devices. The insulating matrix layer 150 may be formed over the interconnect-level dielectric layers. Other passive devices may be formed in BEOL processes. For example various capacitors, inductors, resistors, and integrated passive devices may be utilized with other BEOL devices.

Figures 2A, 2B, 2C:
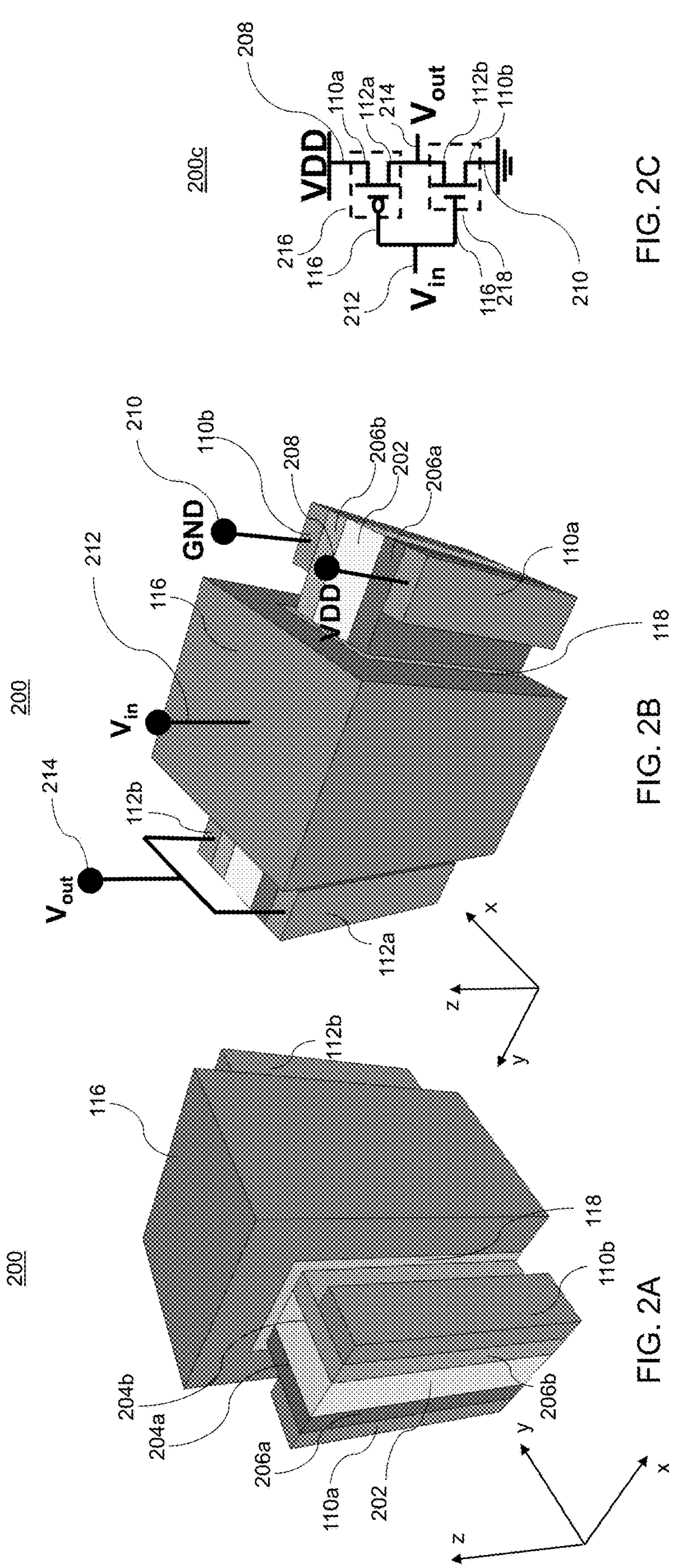
FIG. 2A is a three-dimensional perspective view of a semiconductor circuit that may be formed in a BEOL process, according to various embodiments.
FIG. 2B is a further three-dimensional perspective view of the semiconductor circuit of FIG. 2A, according to various embodiments.
FIG. 2C is a schematic equivalent circuit describing the semiconductor circuit of FIGS. 2A and 2B, according to various embodiments.

FIG. 2A is a three-dimensional perspective view of a semiconductor circuit 200 that may be formed in a BEOL process, and FIG. 2B is a further three-dimensional perspective view of the semiconductor circuit 200 of FIG. 2A, according to various embodiments. FIG. 2C is a schematic equivalent circuit 200*c* describing the semiconductor circuit 200 of FIGS. 2A and 2B, according to various embodiments. As shown in FIGS. 2A and 2B, the semiconductor circuit 200 may include an electrically insulating structure 202 having a slab geometry including a first surface 204*a* and a second surface 204*b* that are parallel to one another and that are each oriented in respective planes that are perpendicular to a thickness direction (e.g., the thickness direction lies along the x direction in FIGS. 2A and 2B). The semiconductor circuit 200 may further include a p-type semiconductor layer 206*a* formed on the first surface 204*a*, an n-type semiconductor layer 206*b* formed on the second surface 204*b*, a gate dielectric layer 118 formed in contact with the p-type semiconductor layer 206*a* and the n-type semiconductor layer 206*b*, and a gate electrode 116 formed in contact with the gate dielectric layer 118.

The semiconductor circuit 200 may further include a first source electrode 110*a* and a first drain electrode 112*a* (e.g., see FIG. 2B) formed in contact with the p-type semiconductor layer 206*a* and a second source electrode 110*b* and a second drain electrode 112*b* formed in contact with the n-type semiconductor layer 206*b*. As shown in FIG. 2B, the first source electrode 110*a* may be electrically connected to a voltage supply 208 (e.g., that may be held at a source voltage VDD) and the second source electrode 110*b* may be connected to a ground voltage terminal 210 (e.g., that may be held at a ground (GND) voltage). The gate electrode 116 may be connected to an input signal terminal 212 and the first drain electrode 112*a* and the second drain electrode 112*b* may be electrically connected to an output signal terminal 214. As such, the semiconductor circuit 200 may be configured as an inverter circuit, as shown in FIG. 2C.

FIG. 2C is a schematic equivalent circuit 200*c* describing the semiconductor circuit 200 of FIGS. 2A and 2B, according to various embodiments. In this regard, the p-type semiconductor layer 206*a* may be configured as a vertical channel layer of a p-channel metal oxide semiconductor field effect transistor (MOSFET) (i.e., a pFET 216) and the n-type semiconductor layer 206*b* may be configured as a vertical channel layer of an n-channel MOSFET transistor (i.e., an nFET 218). Thus, the pFET 216 includes the p-type semiconductor layer 206*a*, the first source electrode 110*a*, the first drain electrode 112*a*, the gate dielectric layer 118, and the gate electrode 116. Similarly, the nFET 218 includes the n-type semiconductor layer 206*b*, the second source electrode 110*b*, the second drain electrode 112*b*, and the gate electrode 116.

A low voltage placed on the input signal terminal 212 turns on the pFET 216 and turns off the nFET 218. Since the source of the pFET 216 (i.e., the first source electrode 110*a*) is connected to the voltage supply 208 that has a high voltage, the output voltage Vout (i.e., the voltage at the first drain electrode 112*a*) will have a high voltage. Similarly, a high voltage placed on the input signal terminal 212 turns on the nFET 218 and turns off the pFET 216. Since the source of the nFET 218 (i.e., the second source electrode 110*b*) is connected to a ground voltage terminal, the output voltage Vout (i.e., the voltage at the second drain electrode 112*b*) will have a low voltage. In this way, a high input signal is converted to a low output signal and a low input signal is converted to a high input signal. As such, the semiconductor circuit 200 is configured as an inverter circuit.

The semiconductor circuit 200 of FIGS. 2A and 2B may be formed over an interlayer dielectric layer having a horizontal interface. For example, the semiconductor circuit 200 may be formed over the insulating matrix layer 150 (e.g., see FIG. 1) or over one or more additional interconnect layers formed over the insulating matrix layer 150. As shown in FIGS. 2A and 2B, the electrically insulating structure 202 may have a vertical orientation such that each of the first surface 204*a* and the second surface 204*b* is perpendicular to the horizontal interface of the interlayer dielectric layer (e.g., see FIG. 1 in which the insulating matrix layer 150 has a horizontal surface).

The interlayer dielectric layer on which the semiconductor circuit 200 is formed (e.g., see lower-level dielectric material layers (136, 138, 140) in FIG. 1) may include one or more electrical interconnect structures (e.g., see first metal interconnect structures (142, 144, 146, 148) in FIG. 1) which may be electrically connected to the semiconductor circuit 200 of FIGS. 2A and 2B. In this regard, one or more of the first source electrode 110*a*, the first drain electrode 112*a*, the second source electrode 110*b*, the second drain electrode 112*b*, and the gate electrode 116, may be electrically connected to the one or more electrical interconnect structures (142, 144, 146, 148) formed in one or more dielectric material layers (136, 138, 140) below the semiconductor circuit 200. In other embodiments, one or more of the first source electrode 110*a*, the first drain electrode 112*a*, the second source electrode 110*b*, the second drain electrode 112*b*, and the gate electrode 116, may be electrically connected to one or more electrical interconnect structures to be subsequently formed above the semiconductor circuit 200.

In one or more embodiments, one or both of the p-type semiconductor layer 206*a* and the n-type semiconductor layer 206*b* may include metal-oxide semiconductors. For example, the p-type semiconductor layer 206*a* may include one or more of NiO, SnO, and $Cu_2O$ and the n-type semiconductor layer 206*b* may include one or more of amorphous silicon, $Al_2O_5Zn_2$ doped ZnO, InGaZnO, InGaO, InWO, InZnO, InSnO, GaO, $Ga_2O_3$, InO, $In_2O_3$, InZnO, TiOx, and alloys thereof. In some embodiments, the n-type semiconductor layer 206*b* may have a composition given by $In_x Ga_y Zn_z MO$, wherein $0<x<1$; $0 \leq y \leq 1$; $0 \leq z \leq 1$; and M is one of Ti, Al, Ag, Ce, and Sn. In other embodiments, the n-type semiconductor layer 206*b* may include an alloy of oxygen, a group-III element, and a group-V element. In other embodiments, the one or more of the n-type semiconductor layer and the p-type semiconductor layer may be formed of a metal-oxide semiconductor having a multi-layer structure.

In some embodiments, the electrically insulating structure 202 may include one or more of AlOx, $SiO_2$, SiNx, or other interlayer dielectric materials, as described above. The gate dielectric layer 118 may be a high-k dielectric material and may include one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, hafnium dioxide-alumina, etc. As described in greater detail below, one or more of the first source electrode 110*a*, the first drain electrode 112*a*, the second source electrode 110*b*, the second drain electrode 112*b* may include one or more of TiN, W, WN, WCN, Co, PdCo, Mo, Cu, TaN, Ti, Al, etc. Other suitable conductor materials may be within the contemplated scope of disclosure.

Figure 2D:
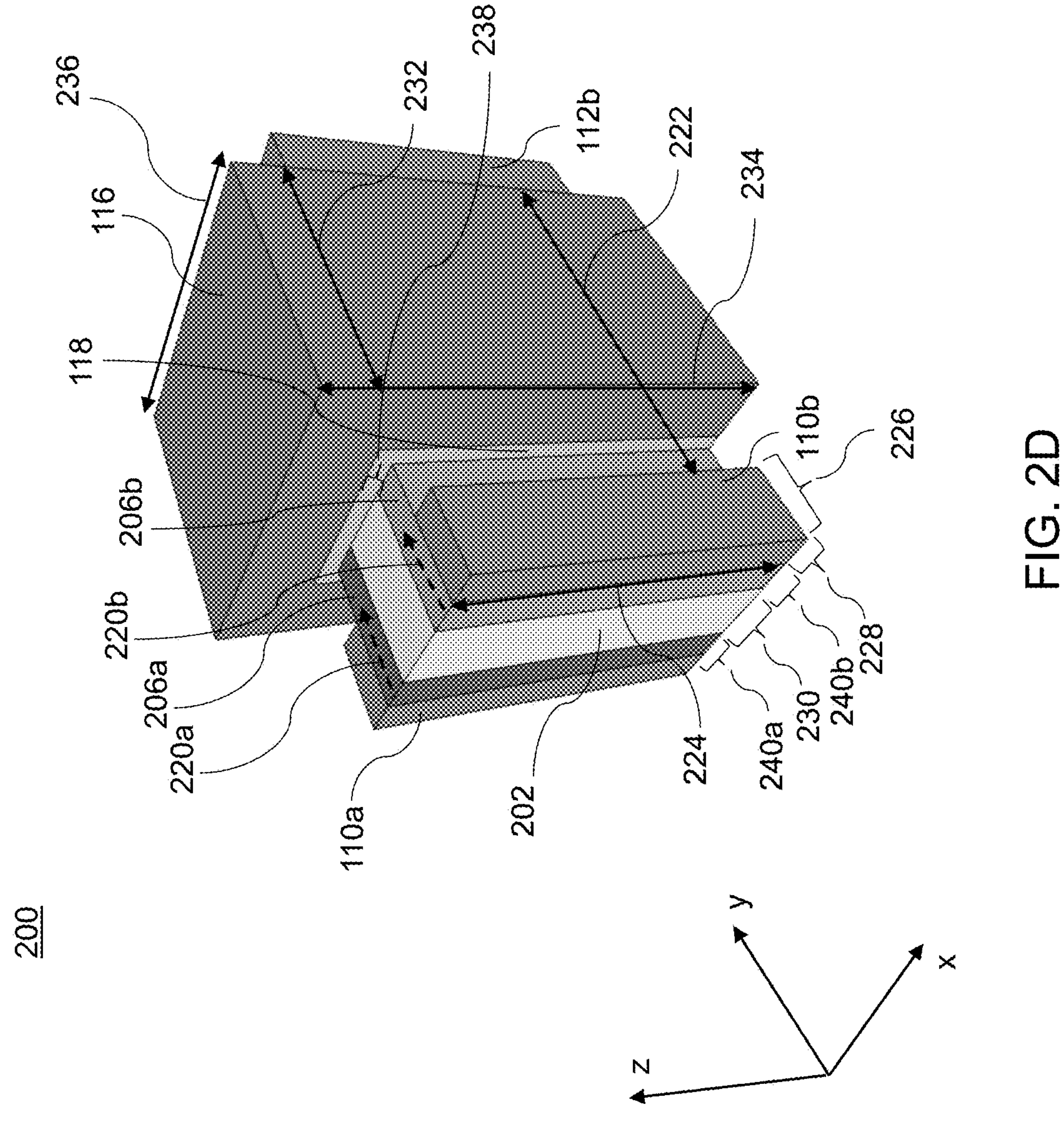
FIG. 2D is a further three-dimensional perspective view of the semiconductor circuit of FIG. 2A showing various dimensions of components of the semiconductor circuit, according to various embodiments.

FIG. 2D is a further three-dimensional perspective view showing various dimensions of components of the semiconductor circuit 200 of FIG. 2A, according to various embodiments. As described above, the p-type semiconductor layer 206*a* may be configured as a p-channel layer of a pFET 216 device and the n-type semiconductor layer 206*b* may be configured as an n-channel layer of an nFET 218 device (e.g., see FIG. 2C). As such, when the respective devices (216, 218) are activated, current may flow as indicated by the dashed arrows (220*a*, 220*b*) in FIG. 2D. In this regard, when the pFET 216 is activated (e.g., by applying a low or zero bias to the gate electrode 116) positive charge carriers (i.e., "holes") may flow from the first source electrode 110*a* to the first drain electrode 112*a* (e.g., see FIG. 2B) giving rise to a first current 220*a*. Similarly, when the nFET 218 is activated (e.g., by applying a high bias to the gate electrode 116) negative charger carriers (i.e., electrons) may flow from the second drain electrode 112*b* to the second source electrode 110*b* but, since the current carried by a negative charge is opposite to its motion, the charge motion in the nFET 218 gives rise to a second current 220*b*, which is in the same direction as first current 220*a* that flows in the pFET 216.

Each of the p-type semiconductor layer 206*a* and the n-type semiconductor layer 206*b* may have a respective channel length 222 and a respective channel width 224. The channel length 222 may have a value greater than 15 nm in various embodiments. An increased value of the channel length 222 may mitigate short channel effects. However, increasing the channel length 222 may result in reduced driving current and a greater size of the semiconductor circuit 200. Thus, it may be possible to optimize the channel length 222 to determine a value sufficiently large to avoid short channel effects while also keeping the size of the semiconductor circuit 200 as small as possible. The channel width 224 may have a value that is greater than 5 nm and less than 500 nm according to various embodiments.

Each of the first source electrode 110*a*, the first drain electrode 112*a* (e.g., see FIG. 2B), the second source electrode 110*b*, and the second drain electrode 112*b* may have a have a source/drain width that is approximately equal to the channel width 224. Each of the source/drain electrodes (110*a*, 110*b*, 112*a*, 112*b*) may also have a source/drain length 226 and source/drain thickness 228, which each may have values that are greater than 5 nm. The electrically insulating structure 202 may have a thickness 230 that is greater than 5 nm and less than 500 nm. The gate electrode 116 may have a gate length 232 and a gate width 234 that may be comparable to the channel length 222 and the channel width 224, respectively. In this regard, the gate length 232 may be greater than 10 nm and the gate width 234 may be greater than 5 nm and less than 500 nm. A top portion of the gate electrode 116 may have a gate thickness 236 that may have a value that is greater than 10 nm and less than 150 nm. The gate dielectric layer 118 may have a gate dielectric thickness 238 that is greater than 2 nm and less than 20 nm. The p-type semiconductor layer 206*a* may have a p-type thickness 240*a* and the n-type semiconductor layer 206*b* may have an n-type thickness 240*b* that may each be greater than 2 nm and less than 50 nm.

Figures 3A, 3B:
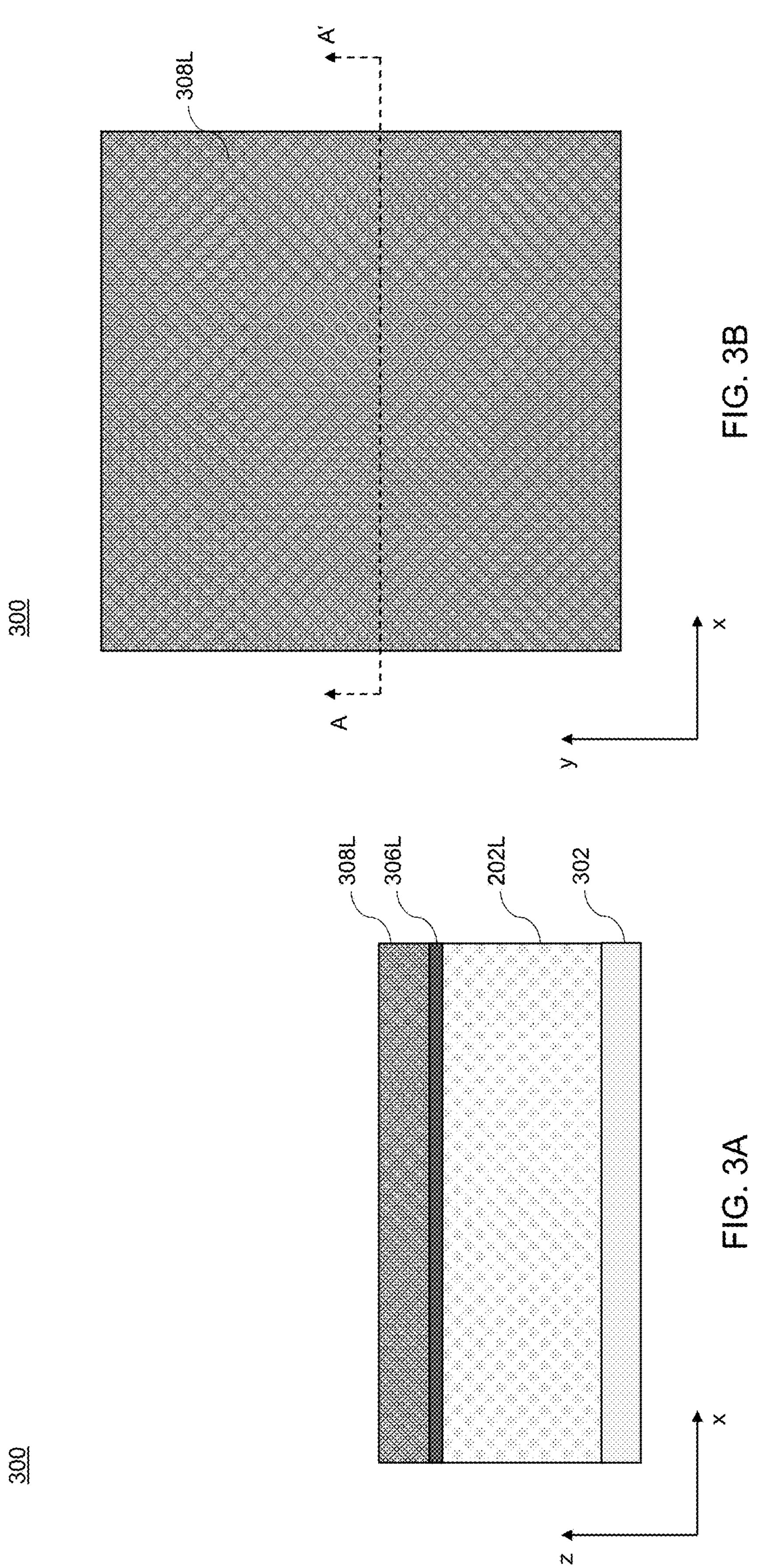
FIG. 3A is a vertical cross-sectional view of an intermediate structure that may be used in the formation of a semiconductor circuit, according to various embodiments.
FIG. 3B is a top view of the intermediate structure of FIG. 3A, according to various embodiments.

FIG. 3A is a vertical cross-sectional view of an intermediate structure 300 that may be used in the formation of a semiconductor circuit 200, and FIG. 3B is a top view of the intermediate structure 300 of FIG. 3A, according to various embodiments. The vertical plane defining the view in FIG. 3A is indicated by the cross section A-A' in FIG. 3B. As shown in FIG. 3A, the intermediate structure 300 may include a substrate 302, an interlayer dielectric layer 202L, an etch-stop layer 306L, and a photoresist 308L.

The substrate 302 may be formed in a BEOL process and, as such, may be a dielectric layer (e.g., an interlayer dielectric or insulating matrix layer 150 from FIG. 1). For example, the substrate 302 may include undoped silicate glass, a doped silicate glass (e.g., deposited by decomposition of tetraethylorthosilicate (TEOS)), organosilicate glass, silicon oxynitride, or silicon carbide nitride. Other suitable dielectric materials are within the contemplated scope of disclosure. The dielectric material of the substrate 302 may be deposited by a conformal deposition process (such as a chemical vapor deposition process) or a self-planarizing deposition process (such as spin coating). The thickness of the substrate 302 may each be in a range from approximately 15 nm to approximately 60 nm, such as from approximately 20 nm to approximately 40 nm, although smaller and larger thicknesses may also be used.

The interlayer dielectric layer 202L may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. The interlayer dielectric layer 202L may be deposited by a conformal deposition process (e.g., chemical vapor deposition (CVD), atomic layer deposition (ALD), physical vapor deposition (PVD), plasma enhanced chemical vapor deposition (PECVD), etc.) or by a self-planarizing deposition process (such as spin coating). In this example, the interlayer dielectric layer 202L may be formed as a planar blanket (i.e., un-patterned) layer having a planar top surface and a planar bottom surface. Excess portions of the interlayer dielectric layer 202L may be removed from above the top surface of the intermediate structure 300 by a planarization process, for example, by chemical mechanical planarization (CMP). A thickness of the interlayer dielectric layer 202L may be in a range from approximately 5 nm to approximately 50 nm, such as from approximately 20 nm to approximately 40 nm, although other embodiments may include smaller and larger thicknesses.

The etch-stop layer 306L may include an etch-stop material such as silicon nitride, silicon carbide, silicon nitride carbide, or a dielectric metal oxide (such as aluminum oxide, titanium oxide, tantalum oxide, etc.). The etch-stop layer 306L may be deposited by a conformal or non-conformal deposition process. In one embodiment, the etch-stop layer 306L may be deposited by CVD, ALD, or PVD. A thickness of the etch-stop layer 306L may be in a range from approximately 2 nm to approximately 20 nm, such as from approximately 3 nm to approximately 12 nm, although smaller and larger thicknesses may also be used.

Figures 4A, 4B:
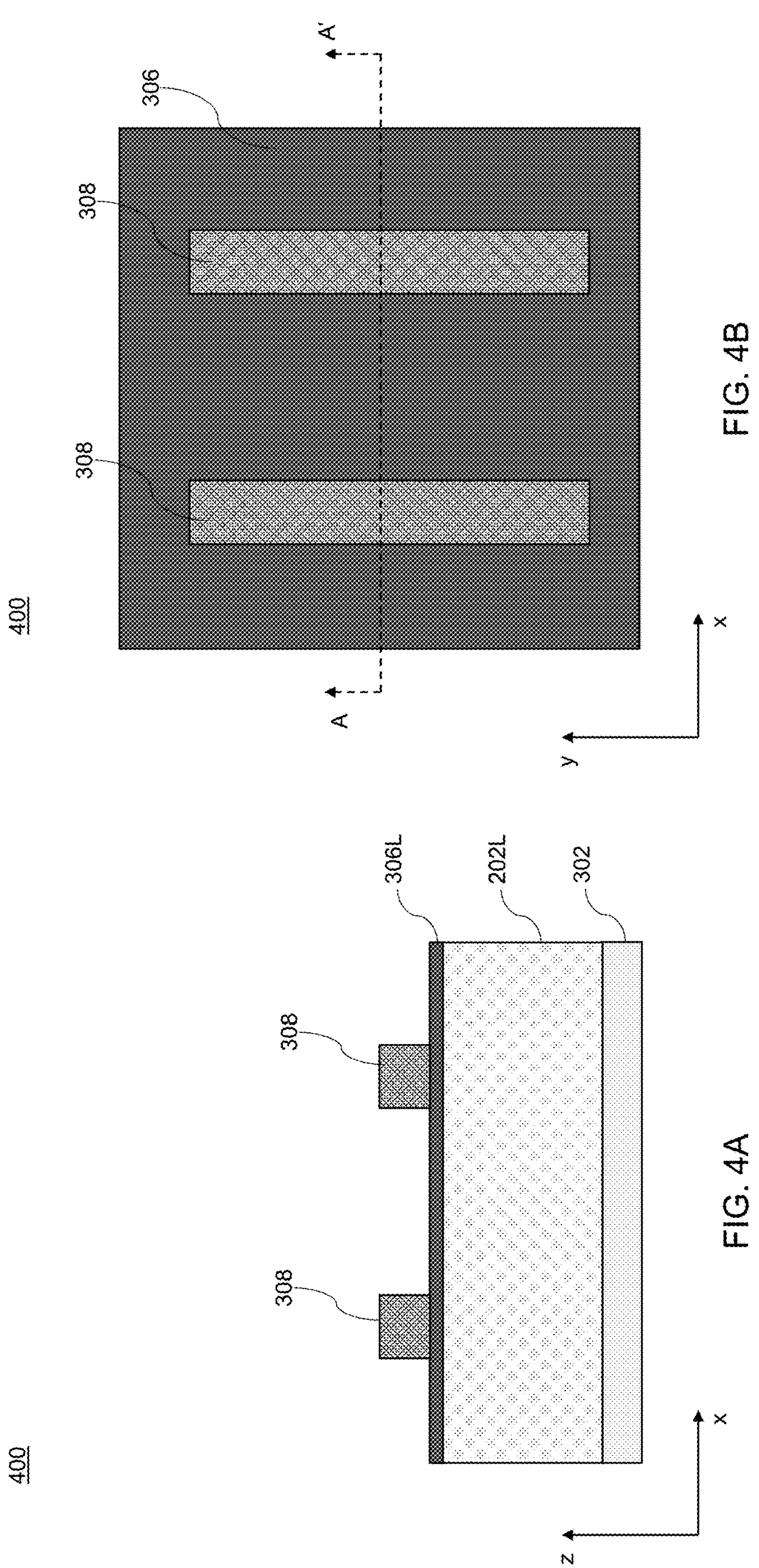
FIG. 4A is a vertical cross-sectional view of a further intermediate structure that may be used in the formation of a semiconductor circuit, according to various embodiments.
FIG. 4B is a top view of the intermediate structure of FIG. 4A, according to various embodiments.

FIG. 4A is a vertical cross-sectional view of a further intermediate structure 400 that may be used in the formation of a semiconductor circuit 200, and FIG. 4B is a top view of the intermediate structure 400 of FIG. 4A, according to various embodiments. The vertical plane defining the view in FIG. 4A is indicated by the cross section A-A' in FIG. 4B. The photoresist 308L of FIGS. 3A and 3B may be formed over the etch-stop layer 306L as a uniform layer, which may then be patterned using lithographic techniques to form a patterned photoresist 308 as shown in FIGS. 4A and 4B.

According to some embodiments, the patterned photoresist 308 may be formed as a periodic array of rectangular shapes over the etch-stop layer 306L. For example, the view of FIGS. 4A and 4B may correspond to one repeat unit of the periodic array of rectangular shapes. Each portion of the patterned photoresist 308 may have width along a first horizontal direction (i.e., the x direction in FIG. 4B) and a length along a second horizontal direction (i.e., the y direction in FIG. 4B). The patterned photoresist 308 may then be used as a mask to pattern the etch-stop layer 306L and interlayer dielectric layer 202L, as described in greater detail with reference to FIGS. 5A and 5B, below.

Figures 5A, 5B:
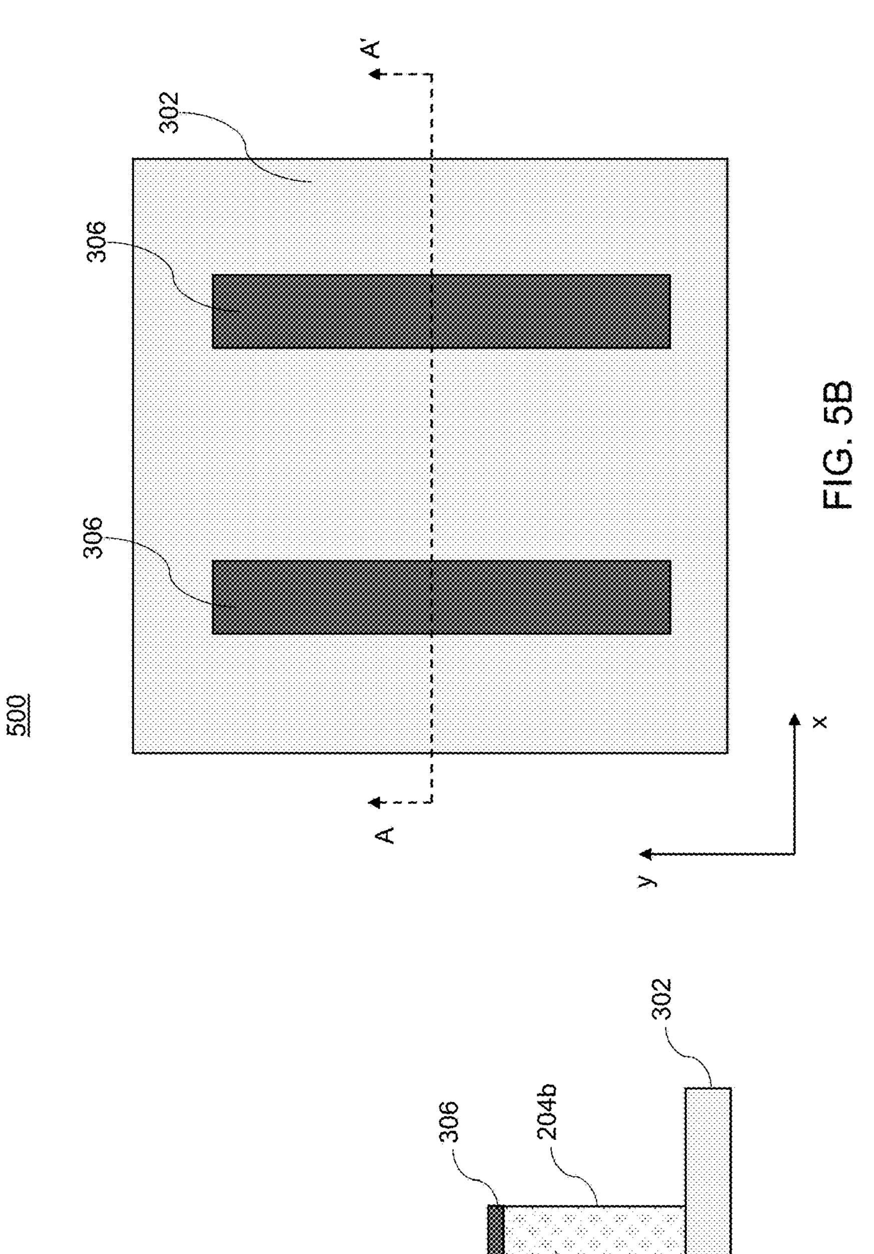
FIG. 5A is a vertical cross-sectional view of a further intermediate structure that may be used in the formation of a semiconductor circuit, according to various embodiments.
FIG. 5B is a top view of the intermediate structure of FIG. 5A, according to various embodiments.

FIG. 5A is a vertical cross-sectional view of a further intermediate structure 500 that may be used in the formation of a semiconductor circuit 200, and FIG. 5B is a top view of the intermediate structure 500 of FIG. 5A, according to various embodiments. The vertical plane defining the view in FIG. 5A is indicated by the cross section A-A' in FIG. 5B. The intermediate structure 500 of FIGS. 5A and 5B may be formed from the intermediate structure 400 of FIGS. 4A and 4B by performing an anisotropic etch process to remove portions of the interlayer dielectric layer 202L and the etch-stop layer 306L that are not masked by the patterned photoresist 308. The patterned photoresist 308 may then be removed by ashing or by dissolution with a solvent. The electrically insulating structure 202, described above with reference to FIGS. 2A to 2D may include the remaining portion of the interlayer dielectric layer 202L after the anisotropic etch process. As shown, each electrically insulating structure 202, formed in this way, may have a slab geometry including a first surface **204*a* and a second surface 204*b* that are parallel to one another and that are each oriented in respective planes that are perpendicular to a thickness direction (e.g., the x direction in FIG. 5A). The intermediate structure 500 also includes remaining portions of the etch-stop layer 306L that form a patterned etch-stop layer 306 formed on top portions of the electrically insulating structure 202**.

Figures 6A, 6B:
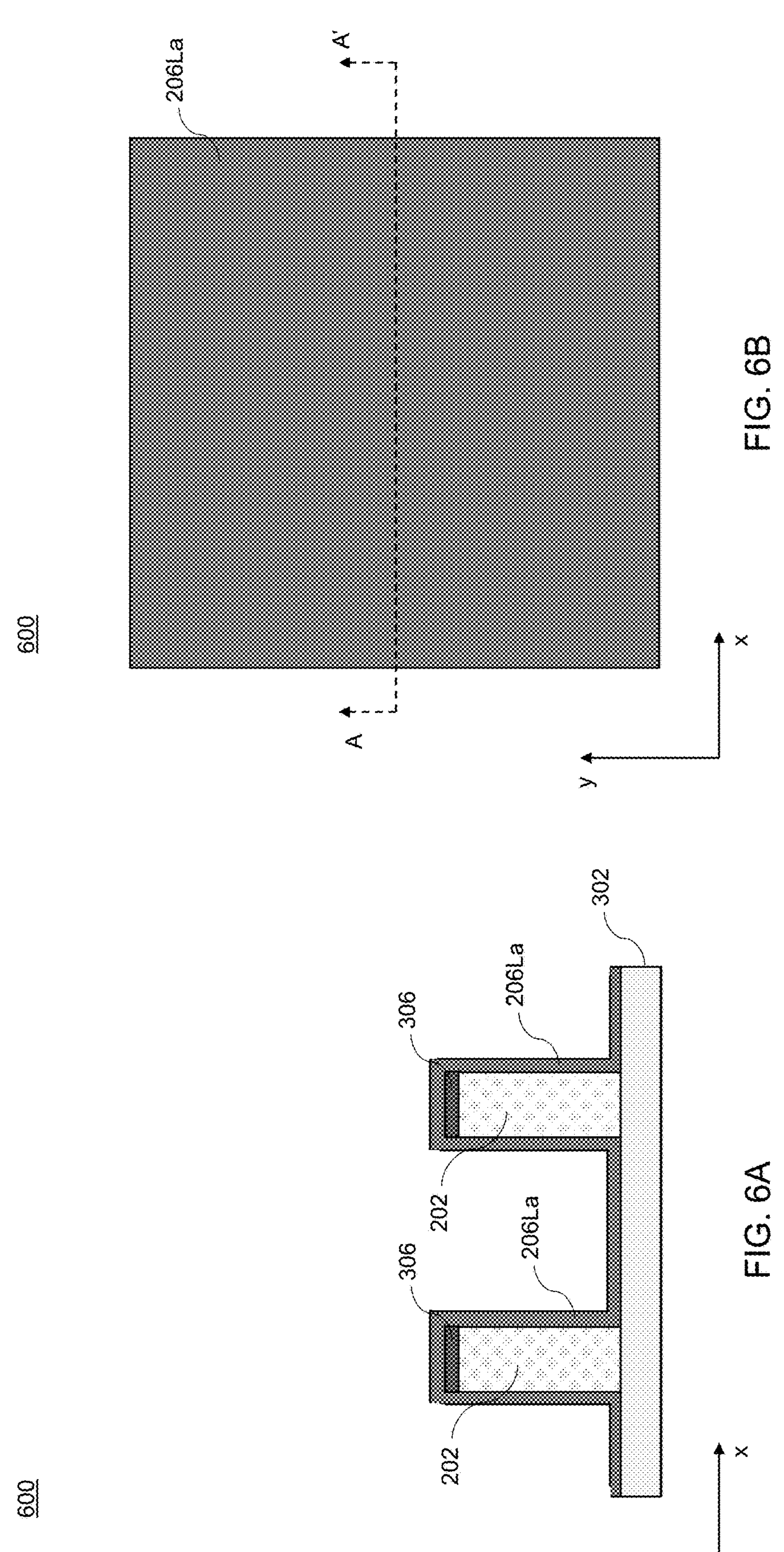
FIG. 6A is a vertical cross-sectional view of a further intermediate structure that may be used in the formation of a semiconductor circuit, according to various embodiments.
FIG. 6B is a top view of the intermediate structure of FIG. 6A, according to various embodiments.

FIG. 6A is a vertical cross-sectional view of a further intermediate structure 600 that may be used in the formation of a semiconductor circuit 200, and FIG. 6B is a top view of the intermediate structure 600 of FIG. 6A, according to various embodiments. The vertical plane defining the view in FIG. 6A is indicated by the cross section A-A' in FIG. 6B. The intermediate structure 600 may be formed by depositing a first oxide semiconductor layer 206La over the intermediate structure 500 of FIGS. 5A and 5B. The first oxide semiconductor layer 206La may be a p-type semiconducting material including, but not limited to, NiO, SnO, and $Cu_2O$, which may be formed by any suitable method such as ALD, CVD, PECVD, PVD, etc. A thickness of the first oxide semiconductor layer 206La may be in a range from approximately 2 nm to approximately 50 nm, such as from approximately 5 nm to approximately 15 nm, although other embodiments may include smaller and larger thicknesses. Following the deposition of the first oxide semiconductor layer 206La, the intermediate structure 600 may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof.

Figure 7B:
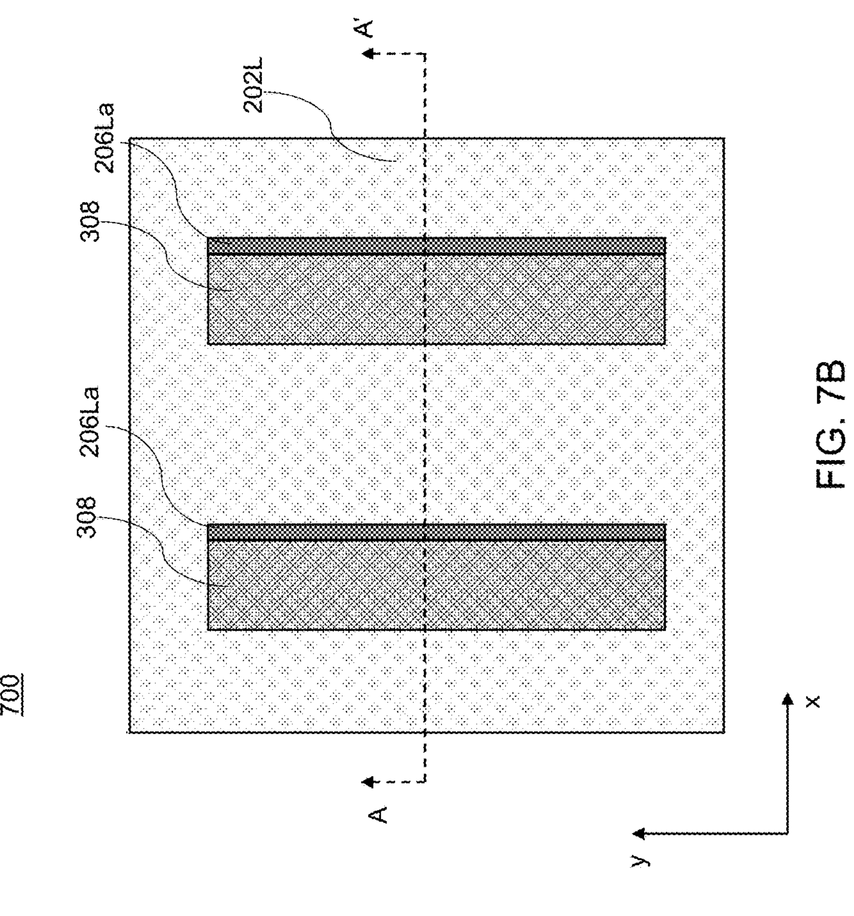
FIG. 7B is a top view of the intermediate structure of FIG. 7A, according to various embodiments.
Figure 7A:
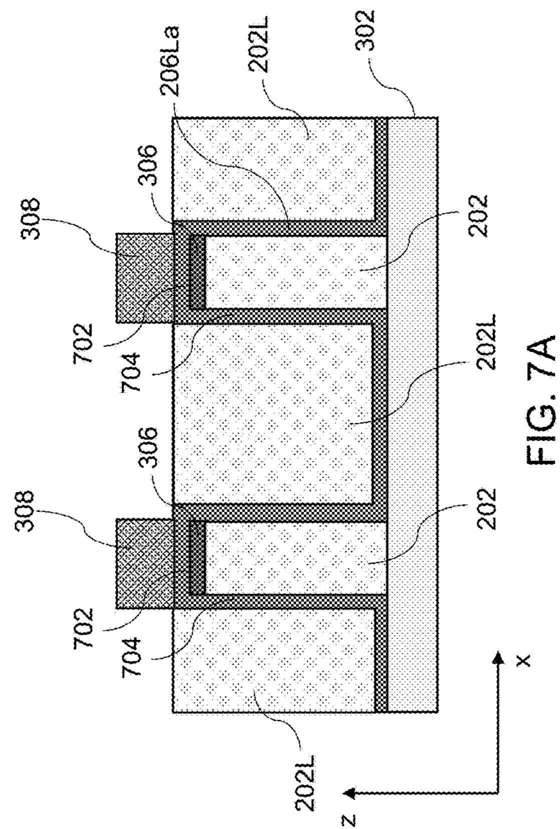
FIG. 7A is a vertical cross-sectional view of a further intermediate structure that may be used in the formation of a semiconductor circuit, according to various embodiments.

FIG. 7A is a vertical cross-sectional view of a further intermediate structure 700 that may be used in the formation of a semiconductor circuit 200, and FIG. 7B is a top view of the intermediate structure 700 of FIG. 7A, according to various embodiments. The vertical plane defining the view in FIG. 7A is indicated by the cross section A-A' in FIG. 7B. The intermediate structure 700 may be formed from the intermediate structure 600 of FIGS. 6A and 6B by depositing an additional interlayer dielectric layer 202L over the intermediate structure 600 followed by formation of an additional patterned photoresist 308. In this regard, the additional interlayer dielectric layer 202L may be deposited by a conformal deposition process (e.g., CVD, ALD, PVD, PECVD, etc.) or by a self-planarizing deposition process (such as spin coating). Excess portions of the interlayer dielectric layer 202L may be removed from above a top surface of the first oxide semiconductor layer 206La by a planarization process, for example, by CMP.

A photoresist layer (not shown) may then be formed over top surfaces of the interlayer dielectric layer 202L and the first oxide semiconductor layer 206La. The photoresist layer may then be patterned using lithographic techniques to generate a patterned photoresist 308, which may then be used as a mask for further etching the intermediate structure 700. As shown in FIG. 7A, the patterned photoresist 308 may be configured to mask a top portion 702 and a side portion 704 of the first oxide semiconductor layer 206La while leaving the remainder of the first oxide semiconductor layer 206La and the interlayer dielectric layer 202L unmasked. The unmasked portions may then be removed in a subsequent anisotropic etch process, as described in greater detail with reference to FIGS. 8A and 8B, below.

Figure 8B:
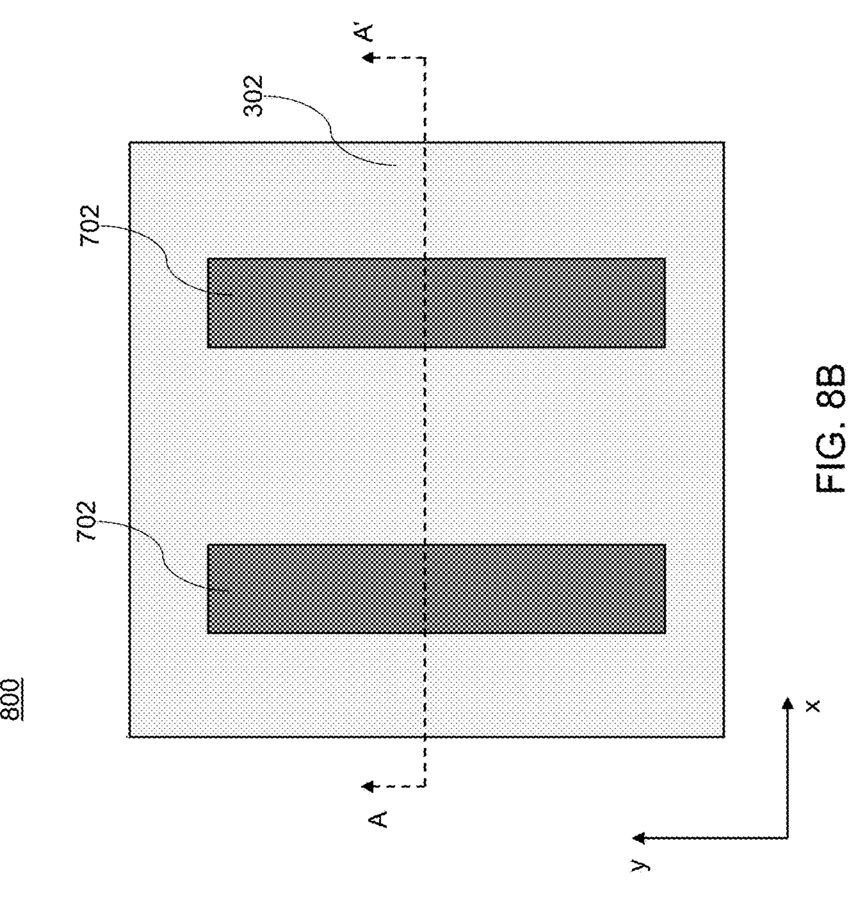
FIG. 8B is a top view of the intermediate structure of FIG. 8A, according to various embodiments.
Figure 8A:
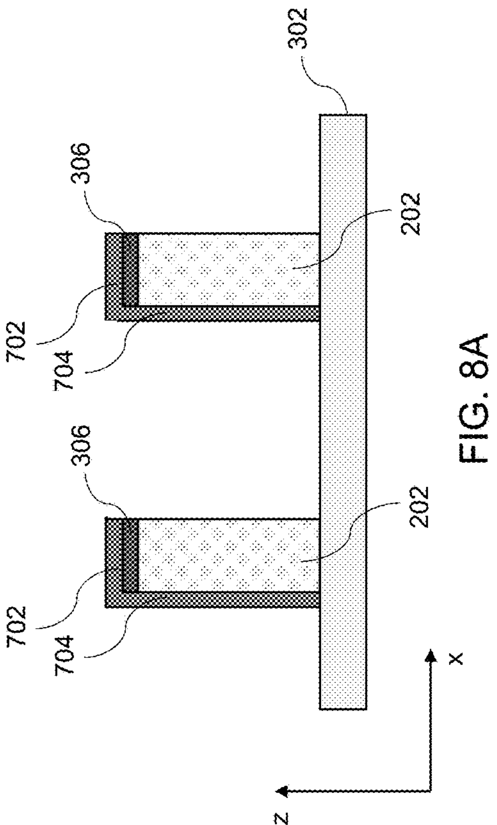
FIG. 8A is a vertical cross-sectional view of a further intermediate structure that may be used in the formation of a semiconductor circuit, according to various embodiments.

FIG. 8A is a vertical cross-sectional view of a further intermediate structure 800 that may be used in the formation of a semiconductor circuit 200, FIG. 8B is a top view of the intermediate structure 800 of FIG. 8A, according to various embodiments. The vertical plane defining the view in FIG. 8A is indicated by the cross section A-A' in FIG. 8B. The intermediate structure 800 may be formed from the intermediate structure 700 of FIG. 7 by performing an anisotropic etch process to remove unmasked portions of the first oxide semiconductor layer 206La and the interlayer dielectric layer 202L, as shown. The patterned photoresist 308 may then be removed by ashing or by dissolution with a solvent. The resulting intermediate structure 800 includes the electrically insulating structure 202, the patterned etch-stop layer 306, along with the remaining top portion 702 and side portion 704 of the first oxide semiconductor layer 206La.

Figures 9A, 9B:
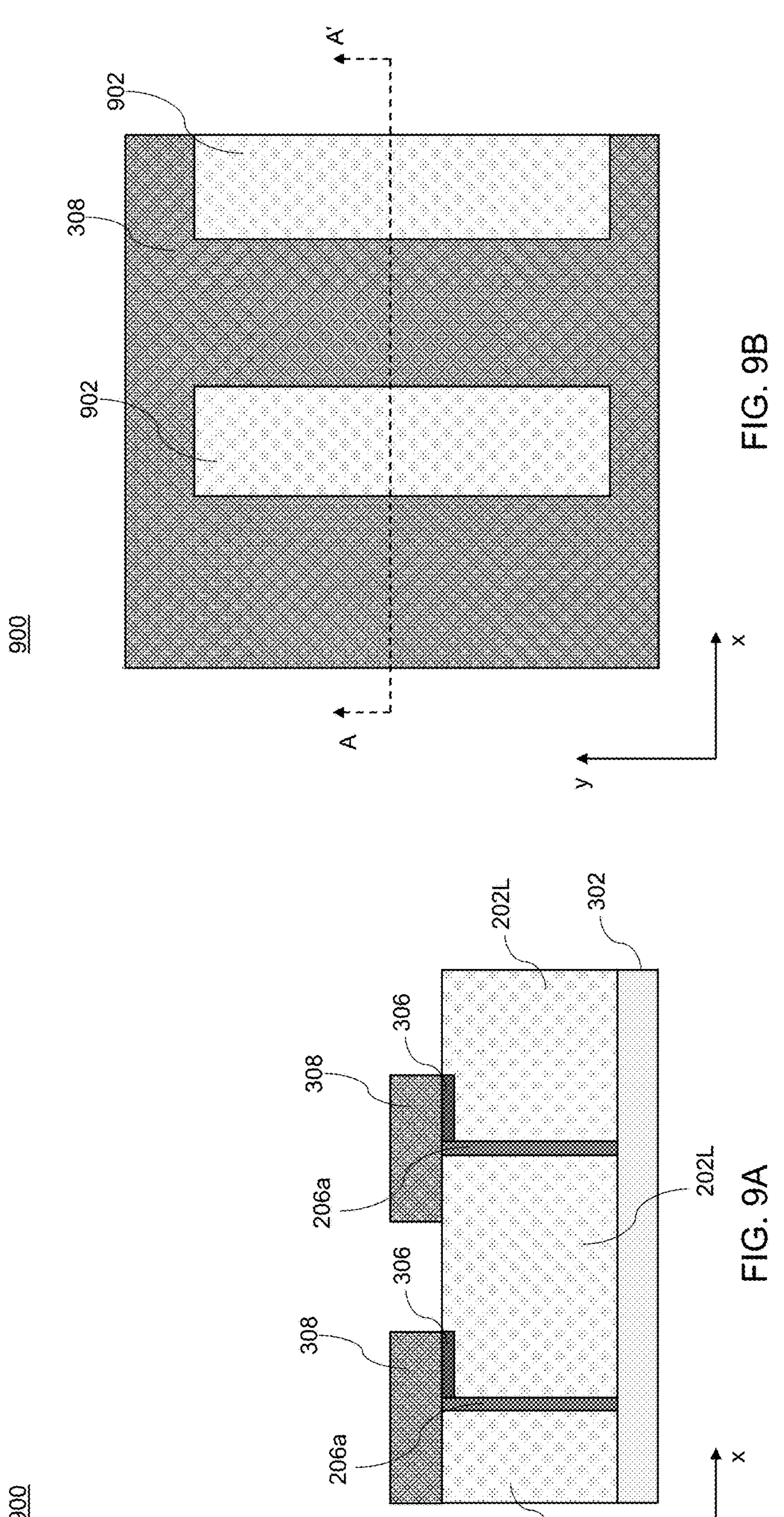
FIG. 9A is a vertical cross-sectional view of a further intermediate structure that may be used in the formation of a semiconductor circuit, according to various embodiments.
FIG. 9B is a top view of the intermediate structure of FIG. 9A, according to various embodiments.

FIG. 9A is a vertical cross-sectional view of a further intermediate structure 900 that may be used in the formation of a semiconductor circuit 200, and FIG. 9B is a top view of the intermediate structure 900 of FIG. 9A, according to various embodiments. The vertical plane defining the view in FIG. 9A is indicated by the cross section A-A' in FIG. 9B. The intermediate structure 900 of FIGS. 9A and 9B may be formed by further depositing an additional interlayer dielectric layer 202L over the intermediate structure 800 and forming a patterned photoresist 308 over the resulting structure.

In this regard, the additional interlayer dielectric layer 202L may be deposited by a conformal deposition process (e.g., CVD, ALD, PVD, PECVD, etc.) or by a self-planarizing deposition process (such as spin coating). Excess portions of the interlayer dielectric layer 202L may be removed from above a top surface of the first oxide semiconductor layer 206La by a planarization process, for example, by CMP. The planarization process may also remove the top portion 702 (e.g., see FIG. 8A) of the first oxide semiconductor layer 206La. A remaining piece of the side portion 704 then forms the p-type semiconductor layer **206*a* of the semiconductor circuit 200 to be subsequently formed. A uniform photoresist layer (not shown) may then be deposited over the planarized surface of the interlayer dielectric layer 202L and the patterned etch-stop layer 306. The uniform photoresist layer may then be patterned using lithographic techniques to form the patterned photoresist 308. As shown in FIG. 9B, the patterned photoresist 308 may include exposed regions 902 that may be etched in a subsequent processing operation, as described in greater detail with reference to FIGS. 10A and 10**B.

Figure 10B:
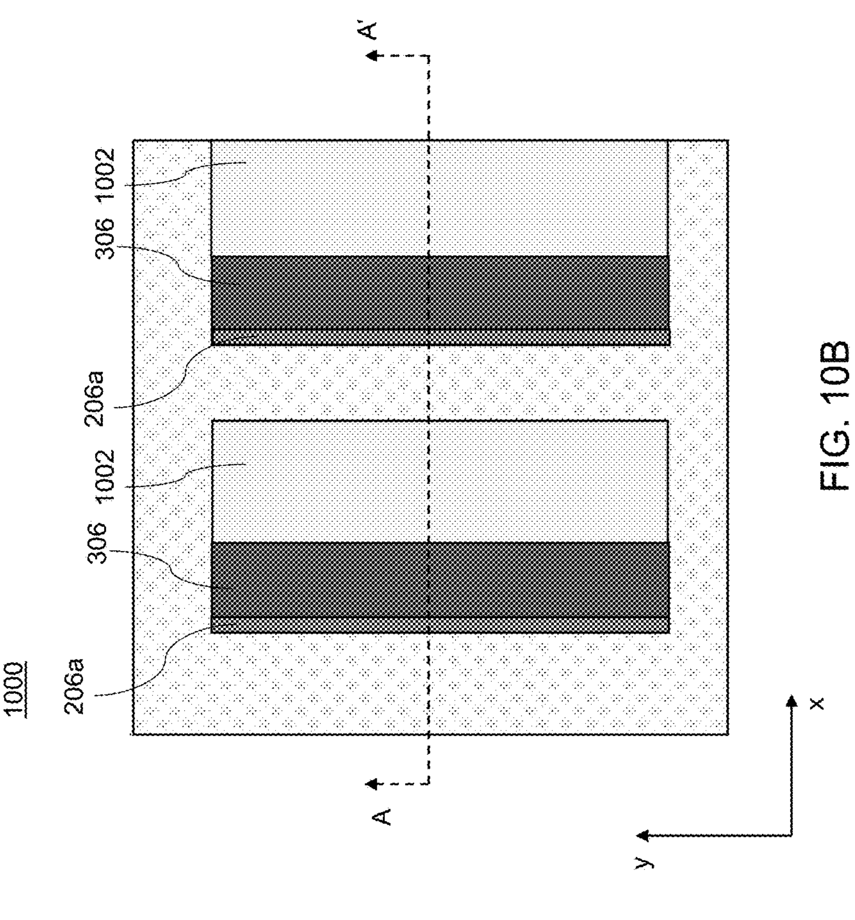
FIG. 10B is a top view of the intermediate structure of FIG. 10A, according to various embodiments.
Figure 10A:
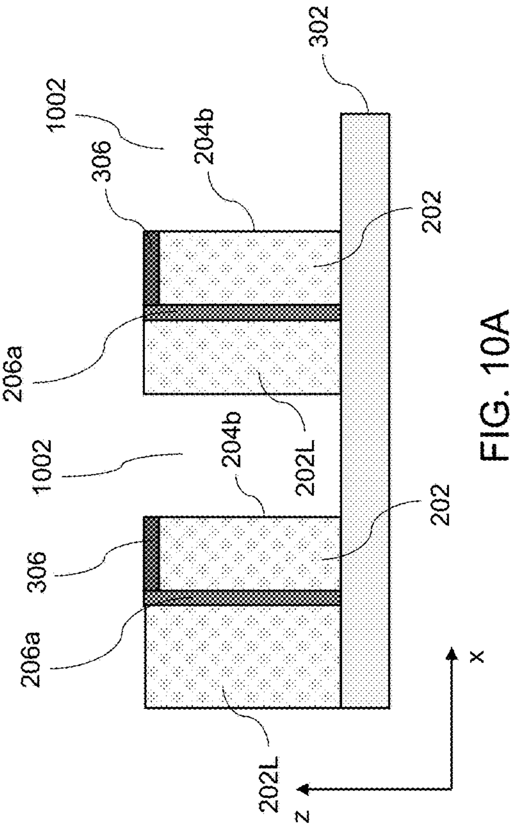
FIG. 10A is a vertical cross-sectional view of a further intermediate structure that may be used in the formation of a semiconductor circuit, according to various embodiments.

FIG. 10A is a vertical cross-sectional view of a further intermediate structure 1000 that may be used in the formation of a semiconductor circuit 200, and FIG. 10B is a top view of the intermediate structure 1000 of FIG. 10A, according to various embodiments. The vertical plane defining the view in FIG. 10A is indicated by the cross section A-A' in FIG. 10B. The intermediate structure 1000 may be formed from the intermediate structure 900 by performing an anisotropic etch process to remove portions of the interlayer dielectric layer 202L that are not masked by the patterned photoresist 308. As such, the anisotropic etch process may generate a trench 1002. The presence of the trench 1002 may allow the subsequent formation of the n-type semiconductor layer 206*b* on the second surface 204*b* of the electrically insulating structure 202 as described in greater detail with reference to FIGS. 11A to 13B, below. After performing the anisotropic etch process, the patterned photoresist 308 may be removed by ashing or by dissolution with a solvent.

Figure 11B:
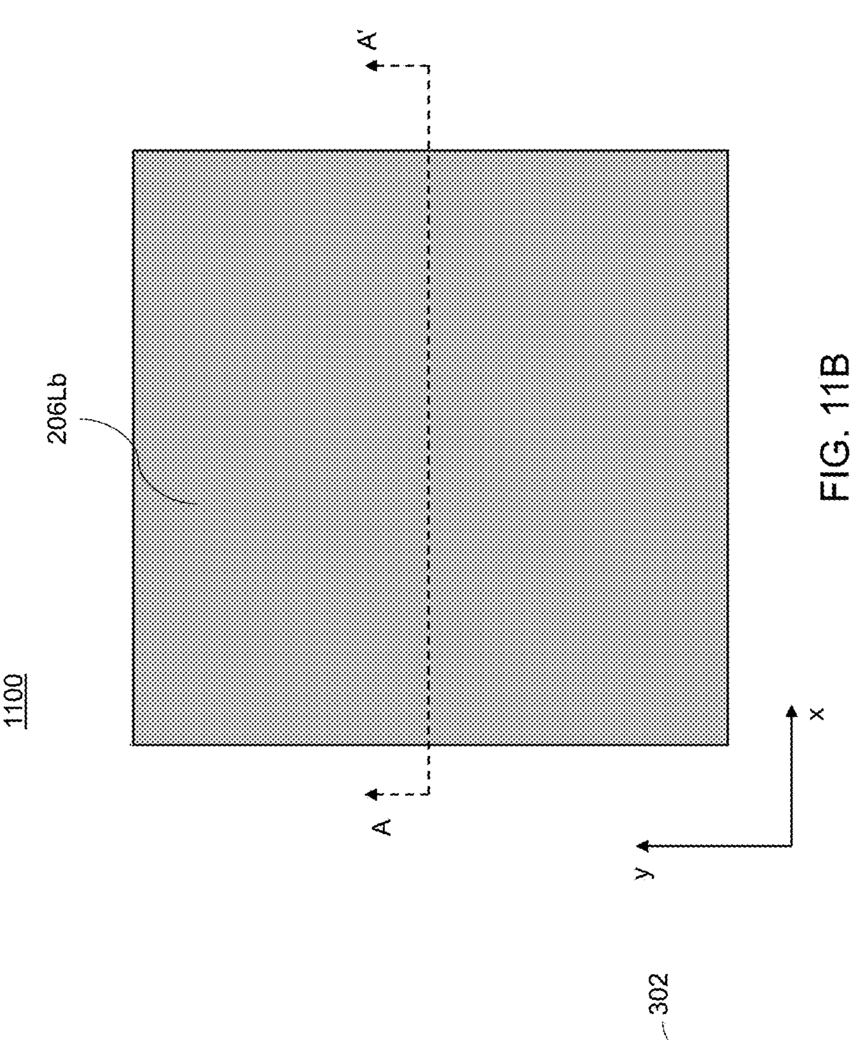
FIG. 11B is a top view of the intermediate structure of FIG. 11A, according to various embodiments.
Figure 11A:
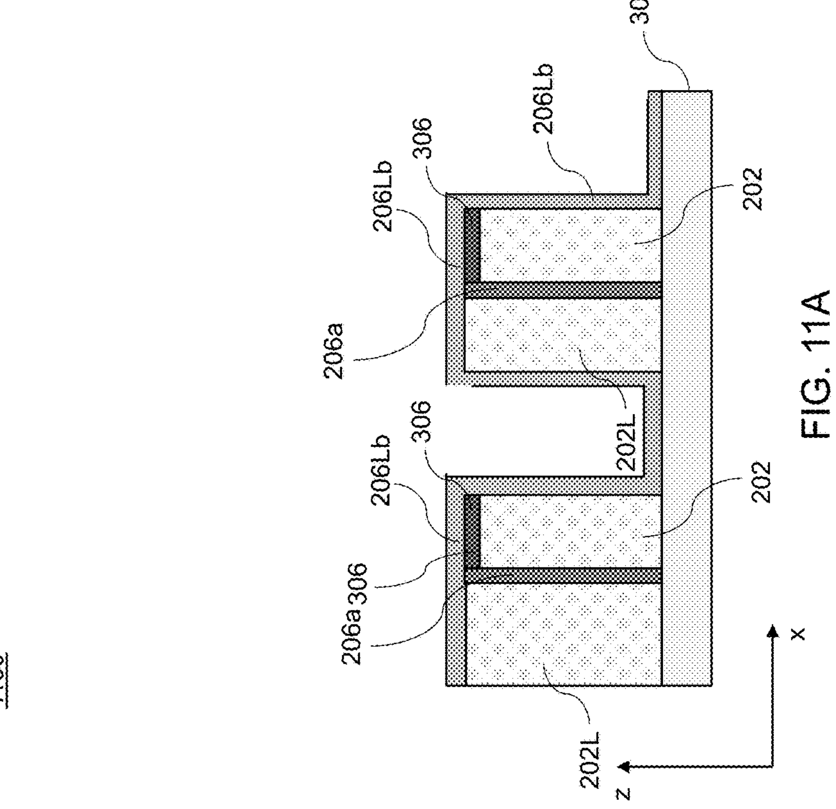
FIG. 11A is a vertical cross-sectional view of a further intermediate structure that may be used in the formation of a semiconductor circuit, according to various embodiments.

FIG. 11A is a vertical cross-sectional view of a further intermediate structure 1100 that may be used in the formation of a semiconductor circuit 200, FIG. 11B is a top view of the intermediate structure 1100 of FIG. 11A, according to various embodiments. The vertical plane defining the view in FIG. 11A is indicated by the cross section A-A' in FIG. 11B. The intermediate structure 1100 may be formed by depositing a second oxide semiconductor layer 206Lb over the intermediate structure 1000 of FIGS. 10A and 10B. The second oxide semiconductor layer 206Lb may be an n-type semiconducting material including, but not limited to, amorphous silicon, Al2O5Zn2 doped ZnO, InGaZnO, InGaO, InWO, InZnO, InSnO, Ga2O3, GaO, InO, In2O3, InZnO, TiOx, and alloys thereof. Other suitable semiconducting materials are within the contemplated scope of disclosure. For example, in various embodiments, the oxide semiconductor layer 206Lb may include a composition given by Inx Gay Znz MO, wherein $0<x<1$; $0\leq y\leq 1$; $0\leq z\leq 1$; and M is one of Ti, Al, Ag, Ce, and Sn. The oxide semiconductor layer 206Lb may be formed by any suitable method such as ALD, CVD, PECVD, PVD, etc.

In an embodiment, the second oxide semiconductor layer 206Lb may be formed over the intermediate structure 1000 of FIGS. 10A and 10B. A thickness of the second oxide semiconductor layer 206Lb may be in a range from approximately 2 nm to approximately 50 nm, such as from approximately 5 nm to approximately 15 nm, although other embodiments may include smaller and larger thicknesses. Following the deposition of the second oxide semiconductor layer 206Lb, the intermediate structure 600 may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof.

Figures 12A, 12B:
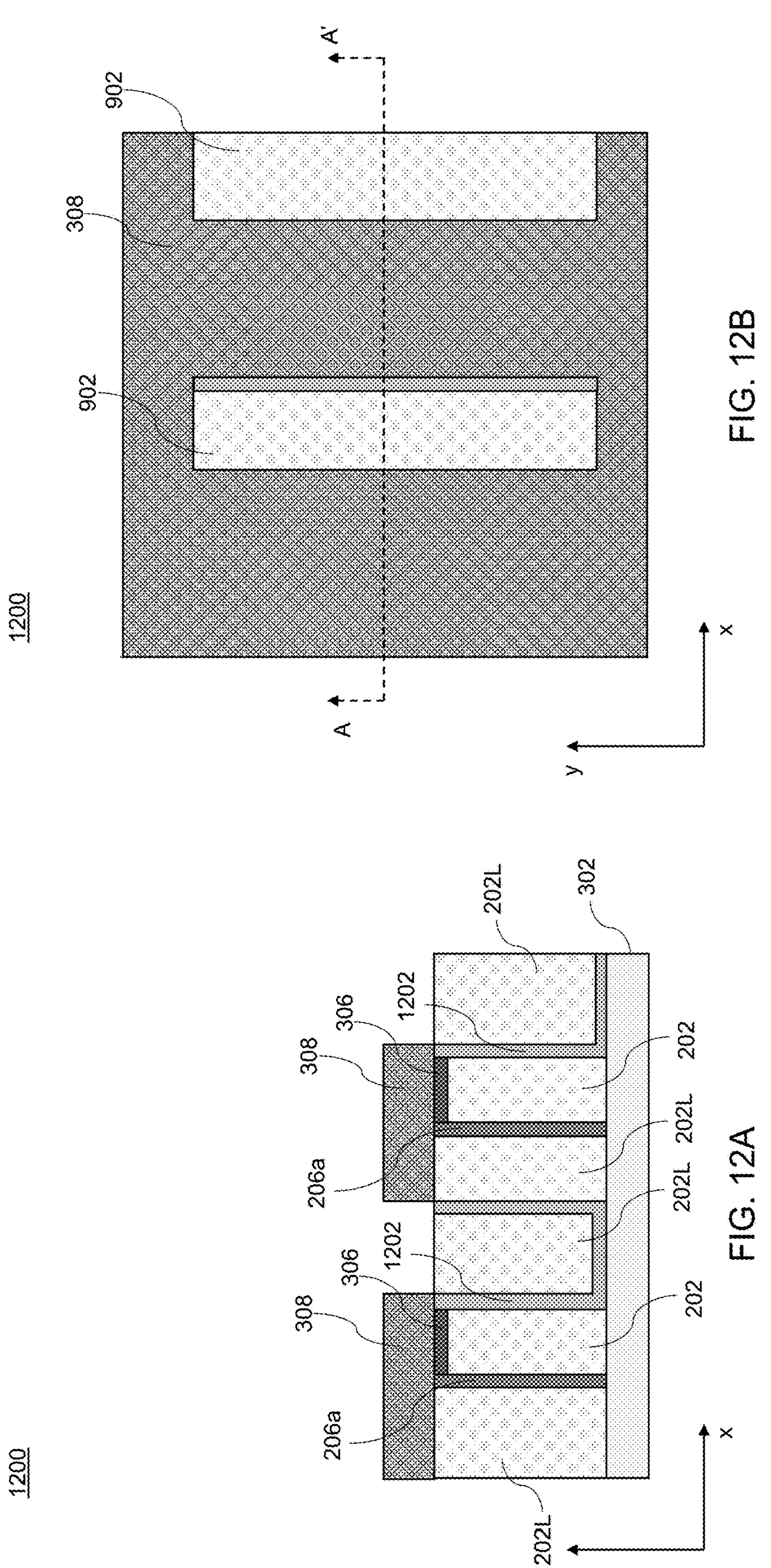
FIG. 12A is a vertical cross-sectional view of a further intermediate structure that may be used in the formation of a semiconductor circuit, according to various embodiments.
FIG. 12B is a top view of the intermediate structure of FIG. 12A, according to various embodiments.

FIG. 12A is a vertical cross-sectional view of a further intermediate structure 1200 that may be used in the formation of a semiconductor circuit 200, FIG. 12B is a top view of the intermediate structure 1200 of FIG. 12A, according to various embodiments. The vertical plane defining the view in FIG. 12A is indicated by the cross section A-A' in FIG. 12B. The intermediate structure 1200 may be formed by depositing an additional interlayer dielectric layer 202L over the intermediate structure 1100 of FIGS. 11A and 11B. A planarization process may then be performed (e.g., using CMP) to remove excess portions of the interlayer dielectric layer 202L and top portions of the second oxide semiconductor layer 206Lb over a top surface of the patterned etch-stop layer 306. A patterned photoresist 308 may then be formed over the resulting structure. As shown in FIG. 12A, the patterned photoresist 308 may mask a side portion 1202 of the second oxide semiconductor layer 206Lb, the patterned etch-stop layer 306, and the p-type semiconductor layer 206*a* while leaving other portions of the interlayer dielectric layer 202L and the second oxide semiconductor layer 206Lb unmasked. As shown in FIG. 12B, the patterned photoresist 308 may include exposed regions 902 that may be etched in a subsequent processing operation, as described in greater detail with reference to FIGS. 13A and 13B.

Figure 13B:
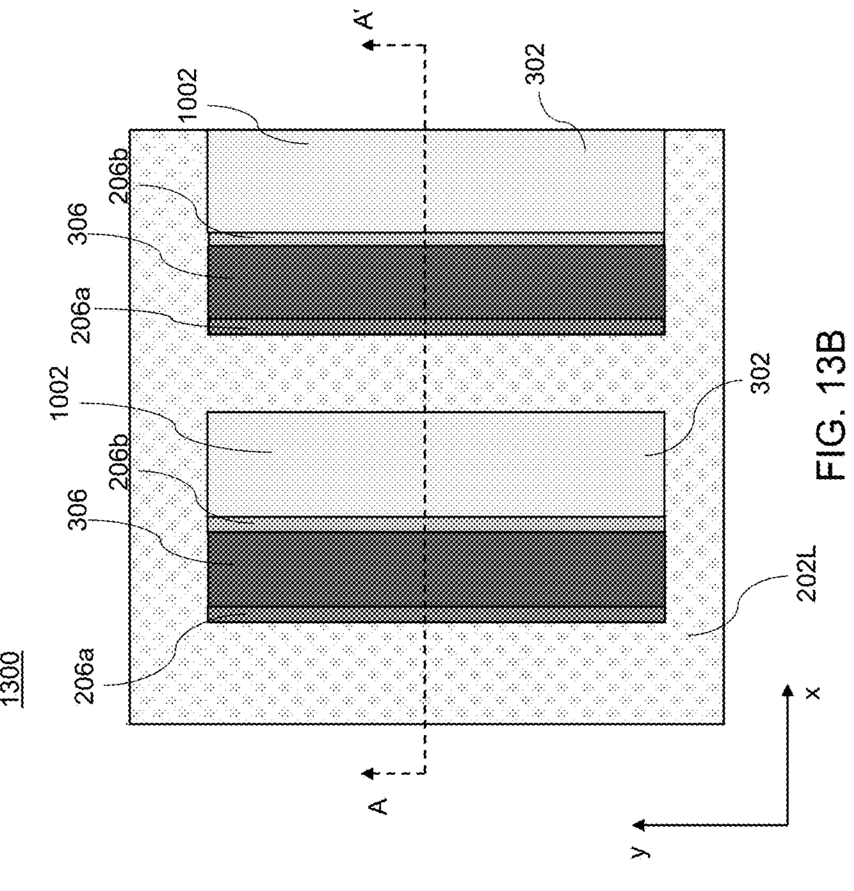
FIG. 13B is a top view of the intermediate structure of FIG. 13A, according to various embodiments.
Figure 13A:
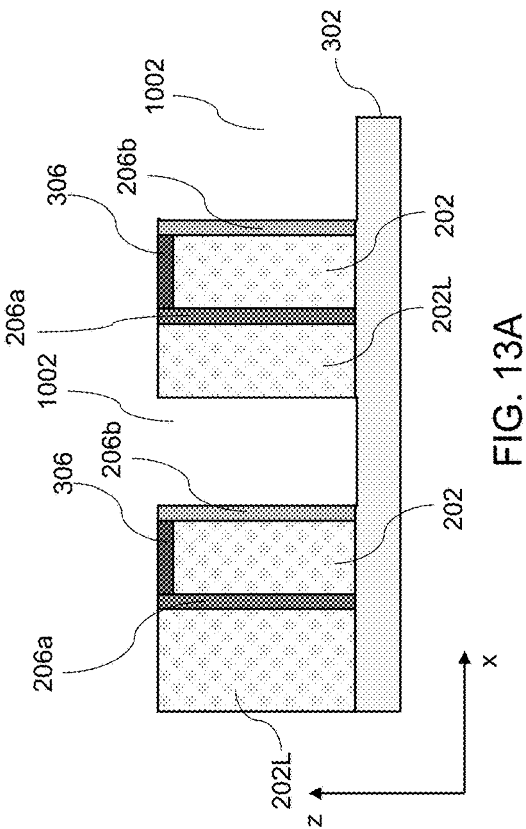
FIG. 13A is a vertical cross-sectional view of a further intermediate structure that may be used in the formation of a semiconductor circuit, according to various embodiments.

FIG. 13A is a vertical cross-sectional view of a further intermediate structure 1300 that may be used in the formation of a semiconductor circuit 200, FIG. 13B is a top view of the intermediate structure 1300 of FIG. 13A, according to various embodiments. The vertical plane defining the view in FIG. 13A is indicated by the cross section A-A' in FIG. 13B. The intermediate structure 1300 may be formed by performing an anisotropic etch process to remove unmasked portions of the second oxide semiconductor layer 206Lb and the interlayer dielectric layer 202L, as shown. The patterned photoresist 308 may then be removed by ashing or by dissolution with a solvent. The resulting intermediate structure 1300 includes the electrically insulating structure 202, the p-type semiconductor layer 206*a*, the patterned etch-stop layer 306, and a remaining portion of the second oxide semiconductor layer 206Lb that forms the n-type semiconductor layer 206*b*. As shown in FIGS. 13A and 13B, the anisotropic etch process may generate trenches 1002 that may be filled with an additional interlayer dielectric layer 202L in a subsequent processing operation, as described in greater detail with reference to FIGS. 14A to 14C, below.

FIG. 14A is a vertical cross-sectional view of a further intermediate structure 1400 that may be used in the formation of a semiconductor circuit 200, and FIG. 14B is a top view of the intermediate structure 1400 of FIG. 14A, according to various embodiments. FIG. 14C is a further vertical cross-sectional view of the intermediate structure of FIGS. 14A and 14B, according to various embodiments. The intermediate structure 1400 may be formed by forming an additional interlayer dielectric layer 202L over the intermediate structure 1300 to thereby fill the trenches 1002. Excess portions of the interlayer dielectric layer 202L may be removed using a planarization process (e.g., using CMP). The vertical plane defining the view in FIG. 14A is indicated by the cross section A-A' in FIG. 14B and the vertical plane defining the view in FIG. 14C is indicated by the cross section C-C' in FIG. 14B. The cross-sectional view of FIG. 14A is used in FIGS. 15A, 15B, 16A, 16B, 17A, and 17B to describe processes used to form the first source electrode 110*a*, the second source electrode 110*b*, the first drain electrode 112*a*, and the second drain electrode 112*b*. The cross-sectional view of FIG. 14C is used in FIGS. 18B to 24B to describe processes used to form the gate electrode 116.

FIG. 15A is a vertical cross-sectional view of a further intermediate structure 1500 that may be used in the formation of a semiconductor circuit 200, and FIG. 15B is a top view of the intermediate structure 1500 of FIG. 15A, according to various embodiments. FIG. 15C is a further vertical cross-sectional view of the intermediate structure of FIGS. 15A and 15B, according to various embodiments. The intermediate structure 1500 may be formed by forming a patterned photoresist 308 over the intermediate structure 1400. As shown in FIGS. 15A and 15B, the patterned photoresist 308 may have openings 1502 that will allow exposed areas of the interlayer dielectric layer 202L to be removed in a subsequent anisotropic etch process, as described in greater detail with reference to FIGS. 16A to 16C.

FIG. 16A is a vertical cross-sectional view of a further intermediate structure 1600 that may be used in the formation of a semiconductor circuit 200, and FIG. 16B is a top view of the intermediate structure 1600 of FIG. 16A, according to various embodiments. FIG. 16C is a further vertical cross-sectional view of the intermediate structure of FIGS. 16A and 16B, according to various embodiments. The intermediate structure 1600 may be formed by performing an anisotropic etch process to remove exposed portions of the interlayer dielectric layer 202L to thereby generate trenches 1002 in the interlayer dielectric layer 202L. As shown, each of the trenches 1002 may be formed next to respective p-type semiconductor layers 206*a* and n-type semiconductor layers 206*b*. The trenches 1002 may then be filled with an electrically conductive material to form the first source electrode 110*a*, the second source electrode 110*b*, the first drain electrode 112*a*, and the second drain electrode 112*b*, as described in greater detail with reference to FIGS. 17A to 17C, below.

FIG. 17A is a vertical cross-sectional view of a further intermediate structure 1700 that may be used in the formation of a semiconductor circuit 200, and FIG. 17B is a top view of the intermediate structure 1700 of FIG. 17A, according to various embodiments. FIG. 17C is a further vertical cross-sectional view of the intermediate structure of FIGS. 17A and 17B, according to various embodiments. The intermediate structure 1700 may be formed by depositing a conductive material 1702 into the trenches 1002. The conductive material 1702 may include a metallic liner material and a metallic fill material. The metallic liner material may include a conductive metals such as Ti, Al, TiN, TiN/W, Ti/Al/Ti, TaN, W, Cu, WN, WCN, PdCo, TiC, TaC, and/or WC. A thickness of the metallic liner material may be in a range from approximately 1 nm to approximately 10 nm, such as from approximately 3 nm to approximately 8 nm, although smaller and larger thicknesses may also be used.

The metallic fill material may include W, Cu, Al, Co, Ru, Mo, Ta, Ti, TiN, alloys thereof, and/or combinations thereof. Other suitable metallic liner and metallic fill materials within the contemplated scope of this disclosure may also be used. A thickness of the metallic fill material may be in a range from approximately 5 nm to approximately 500 nm, such as from approximately 20 nm to approximately 40 nm, although smaller and larger thicknesses may also be used. The metallic liner material and metallic fill materials may be formed by suitable deposition process, which may include one or more of a CVD process, a PVD process, an ALD process, an electroplating process, etc. Other suitable deposition processes are within the contemplated scope of disclosure. The patterned photoresist 308 may then be removed by ashing or by dissolution with a solvent. Excess portions of the conductive material 1702 may then be removed from above a horizontal plane including the top surface of the interlayer dielectric layer 202L by a planarization process such as CMP, although other suitable planarization processes may be used. The remaining portions of the conductive material 1702 material form the first source electrode 110*a*, the second source electrode 110*b*, the first drain electrode 112*a*, and the second drain electrode 112*b* (e.g. first source electrode 110*a* and the second source electrode 110*b* are shown in FIG. 18A). In some embodiments, one or more of the first source electrode 110*a*, the first drain electrode 112*a*, the second source electrode 110*b*, the second drain electrode 112*b* may include one or more alloys of one or more of W, Mo, Co, Pd, Ti, and mixtures thereof, with or without N and/or O, deposited by chemical vapor deposition or by atomic layer deposition.

Figure 18D:
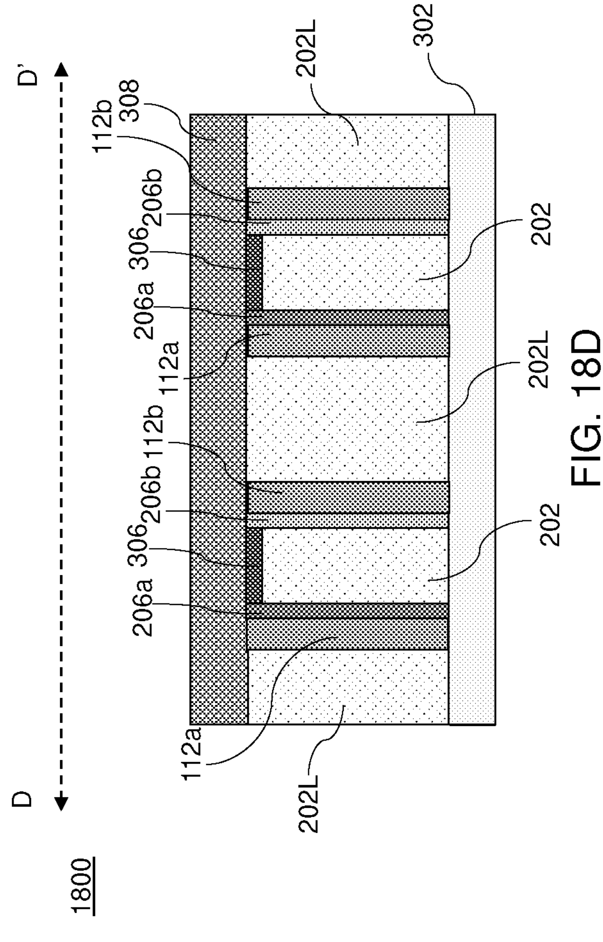

FIG. 18A is a vertical cross-sectional view of a further intermediate structure 1800 that may be used in the formation of a semiconductor circuit 200, and FIG. 18B is a top view of the intermediate structure 1800 of FIG. 18A, according to various embodiments. FIG. 18C taken through CC' of FIG. 18B is a further vertical cross-sectional view of the intermediate structure of FIG. 18B, according to various embodiments. The intermediate structure 1800 may be formed by removing the patterned photoresist 308 of the intermediate structure 1700 and planarizing the intermediate structure 1700 followed by forming a new forming a patterned photoresist 308 over the resulting structure. As a result, FIG. 18A taken through AA' of FIG. 18B and FIG. 18D taken through DD' of FIG. 18B represent concurrent formations of source electrodes 110*a*/110*b* and drain electrodes 112*a*/112*b*, respectively. As shown in FIGS. 15B, 16B, and 17B, source electrodes and drain electrodes are formed together explicitly because of inherent nature of openings design and metal formation therein. As shown in FIGS. 18B and 18C, the patterned photoresist 308 may have openings 1502 that will allow exposed areas of the interlayer dielectric layer 202L to be removed in a subsequent anisotropic etch process, as described in greater detail with reference to FIGS. 19A to 19C.

FIG. 19A is a vertical cross-sectional view of a further intermediate structure 1900 that may be used in the formation of a semiconductor circuit 200, and FIG. 19B is a top view of the intermediate structure 1900 of FIG. 19A, according to various embodiments. FIG. 19C is a further vertical cross-sectional view of the intermediate structure of FIGS. 19A and 19B, according to various embodiments. The intermediate structure 1900 may be formed by performing an anisotropic etch process to remove exposed portions of the interlayer dielectric layer 202L to thereby generate trenches 1002 in the interlayer dielectric layer 202L. As shown, each of the trenches 1002 may be formed next to respective p-type semiconductor layers 206*a* and n-type semiconductor layers 206*b*. The trenches 1002 may then be filled with a gate dielectric layer 118 and an electrically conductive material to form the gate electrode 116 as described in greater detail with reference to FIGS. 20A to 24C, below.

FIG. 20A is a vertical cross-sectional view of a further intermediate structure 2000 that may be used in the formation of a semiconductor circuit 200, and FIG. 20B is a top view of the intermediate structure 2000 of FIG. 20A, according to various embodiments. FIG. 20C is a further vertical cross-sectional view of the intermediate structure of FIGS. 20A and 20B, according to various embodiments. The intermediate structure 2000 may be formed by depositing a gate dielectric layer 118 over the intermediate structure 1900 of FIG. 19. The gate dielectric layer 118 may include, but is not limited to, silicon dioxide, silicon nitride, silicon oxynitride, hafnium oxide, hafnium silicon oxide, tantalum oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. Other suitable dielectric materials are within the contemplated scope of disclosure. In other embodiments, the gate dielectric layer 118 may include an alternating multi-layer structure including silicon oxide and silicon nitride. In other embodiments, the gate dielectric layer 118 may include a ferroelectric material.

The gate dielectric layer 118 may be formed by any suitable technique such as ALD, CVD, PECVD, PVD, etc. A thickness of the gate dielectric layer 118 may be in a range from approximately 2 nm to approximately 20 nm, such as from approximately 5 nm to approximately 12 nm, although other embodiments may include smaller and larger thicknesses. Following the deposition of the gate dielectric layer 118, the intermediate structure 2000 may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof.

FIG. 21A is a vertical cross-sectional view of a further intermediate structure 2100 that may be used in the formation of a semiconductor circuit 200, and FIG. 21B is a top view of the intermediate structure 2100 of FIG. 21A, according to various embodiments. FIG. 21C is a further vertical cross-sectional view of the intermediate structure of FIGS. 21A and 21B, according to various embodiments. The intermediate structure 2100 may be formed by depositing a conductive material 1702 over the intermediate structure 1900. The conductive material 1702 may include a metallic liner material and a metallic fill material. The metallic liner material may include a conductive metals such as Ti, Al, TiN, TiN/W, Ti/Al/Ti, TaN, W, Cu, WN, WCN, PdCo, TiC, TaC, and/or WC. A thickness of the metallic liner material may be in a range from approximately 1 nm to approximately 10 nm, such as from approximately 3 nm to approximately 8 nm, although smaller and larger thicknesses may also be used.

The metallic fill material may include W, Cu, Al, Co, Ru, Mo, Ta, Ti, TiN, alloys thereof, and/or combinations thereof. Other suitable metallic liner and metallic fill materials within the contemplated scope of this disclosure may also be used. A thickness of the metallic fill material may be in a range from approximately 5 nm to approximately 150 nm, such as from approximately 20 nm to approximately 40 nm, although smaller and larger thicknesses may also be used. The metallic liner material and metallic fill materials may be formed by suitable deposition process, which may include one or more of a CVD process, a PVD process, an ALD process, an electroplating process, etc. Other suitable deposition processes are within the contemplated scope of disclosure.

Figures 22A, 22B, 22C:
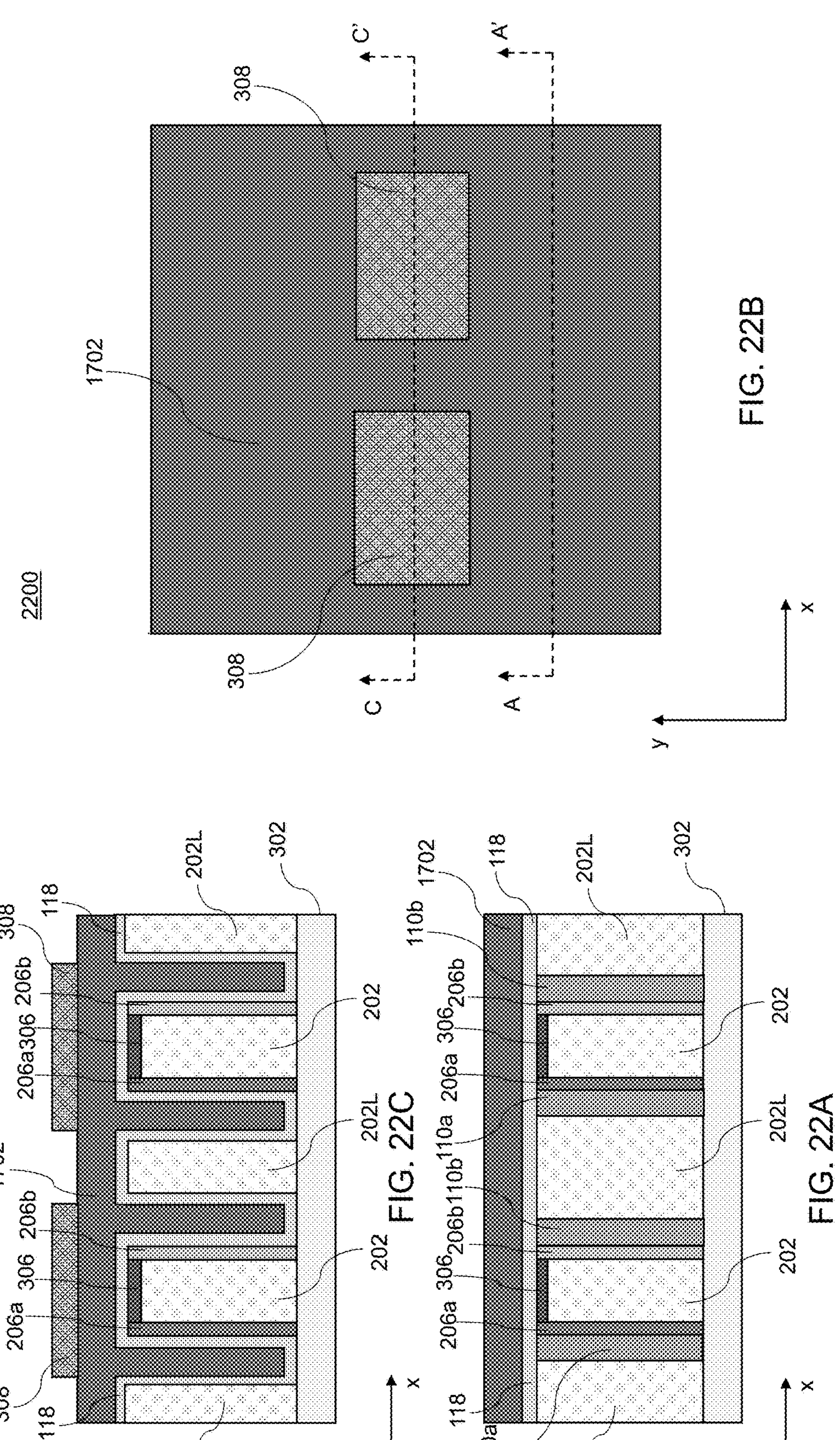
FIG. 22A is a vertical cross-sectional view of a further intermediate structure that may be used in the formation of a semiconductor circuit, according to various embodiments.
FIG. 22B is a top view of the intermediate structure of FIG. 22A, according to various embodiments.
FIG. 22C is a further vertical cross-sectional view of the intermediate structure of FIGS. 22A and 22B, according to various embodiments.

FIG. 22A is a vertical cross-sectional view of a further intermediate structure 2200 that may be used in the formation of a semiconductor circuit 200, and FIG. 22B is a top view of the intermediate structure 2200 of FIG. 22A, according to various embodiments. FIG. 22C is a further vertical cross-sectional view of the intermediate structure of FIGS. 22A and 22B, according to various embodiments. The intermediate structure 2200 may be formed by forming a patterned photoresist 308 over the intermediate structure 2100. The patterned photoresist 308 may then be used to etch unmasked portions of the conductive material 1702 to thereby form the gate electrode 116.

FIG. 23A is a vertical cross-sectional view of a further intermediate structure 2300 that may be used in the formation of a semiconductor circuit 200, and FIG. 23B is a top view of the intermediate structure 2300 of FIG. 23A, according to various embodiments. FIG. 23C is a further vertical cross-sectional view of the intermediate structure of FIGS. 23A and 23B, according to various embodiments. The intermediate structure 2300 may be formed by performing an anisotropic etch process to removed portions of the 1702 that are not masked by the patterned photoresist 308 of the intermediate structure 2200. The patterned photoresist 308 may then be removed by ashing or by dissolution with a solvent. As shown, the anisotropic etch process may generate gate electrodes 116 that are electrically separated from one another.

Figures 24A, 24B, 24C, 24D:
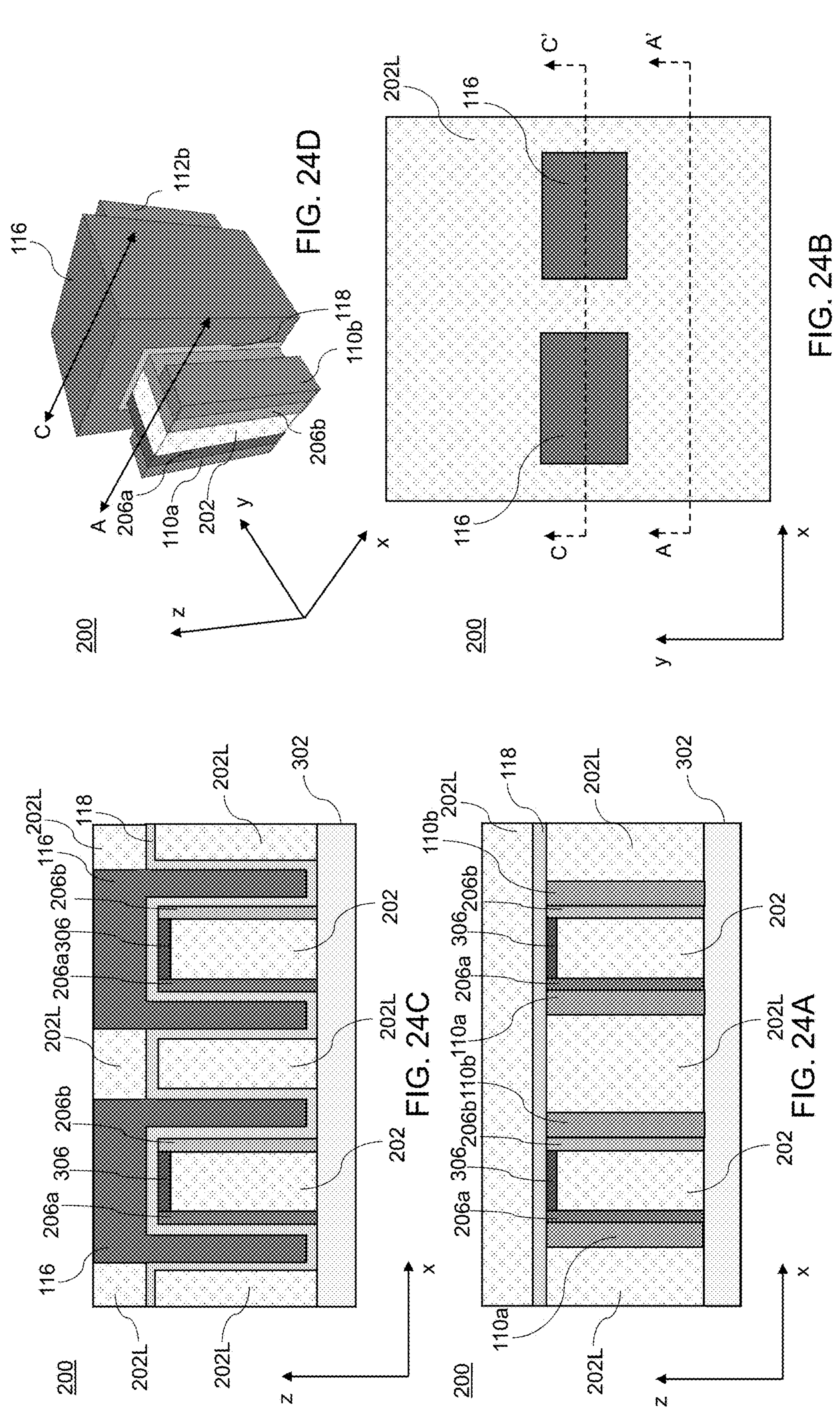
FIG. 24A is a vertical cross-sectional view of the semiconductor circuit formed by the processes described with reference to FIGS. 3A to 23C, according to various embodiments.
FIG. 24B is a top view of the semiconductor circuit of FIG. 24A, according to various embodiments.
FIG. 24C is a further vertical cross-sectional view of the semiconductor circuit of FIGS. 24A and 24B, according to various embodiments.
FIG. 24D is a three-dimensional perspective view of the semiconductor circuit of FIGS. 24A to 24C, according to various embodiments.

FIG. 24A is a vertical cross-sectional view of the semiconductor circuit 200 formed by the processes described with reference to FIGS. 3A to 23C, and FIG. 24B is a top view of the semiconductor circuit 200 of FIG. 24A, according to various embodiments. FIG. 24C is a further vertical cross-sectional view of semiconductor circuit of FIGS. 24A and 24B, and FIG. 24D is a three-dimensional perspective view of the semiconductor circuit of FIGS. 24A to 24C, according to various embodiments. The view of FIG. 24D shows the semiconductor circuit 200 with the surrounding interlayer dielectric layer 202L and gate dielectric 118 removed for clarity. The views of FIGS. 24A and 24C are indicated by the double arrows labeled A and C in FIG. 24D.

The semiconductor circuit 200 of FIGS. 24A to 24D may be formed from the intermediate structure 2300 by deposition of an additional interlayer dielectric layer 202L. Excess portions of the additional interlayer dielectric layer 202L may be removed over a top surface of the gate electrode 116 by a planarization process. As shown in FIGS. 24A and 24C, the planarization process may generate a flat surface of the interlayer dielectric layer 202L that is even with a surface of the gate electrode 116. As such, additional circuit elements may be formed above the semiconductor circuit 200 in subsequent processing operations. For example, additional interlayer dielectric layers 202L and various electrical interconnect structures may be formed above the semiconductor circuit 200. For example, one or more of the first source electrode 110*a*, the first drain electrode 112*a*, the second source electrode 110*b*, the second drain electrode 112*b*, and the gate electrode 116, may be electrically connected to the one or more electrical interconnect structures to be subsequently formed above the semiconductor circuit 200. Alternatively, or additionally, one or more of the first source electrode 110*a*, the first drain electrode 112*a*, the second source electrode 110*b*, the second drain electrode 112*b*, and the gate electrode 116, may be electrically connected to the one or more electrical interconnect structures (142, 144, 146, 148) formed in one or more dielectric material layers (136, 138, 140) below the semiconductor circuit 200.

FIG. 25 is a flowchart illustrating operations of a method 2500 of forming a semiconductor circuit 200, according to various embodiments. In operation 2502 the method 2500 may include forming an electrically insulating structure 202 having a slab geometry including a first surface 204*a* and a second surface 204*b* that are parallel to one another and that are each oriented in respective planes that are perpendicular to a thickness direction (e.g., the x direction in FIGS. 2A, 2B, 13A, and 13B). In operation 2504 the method 2500 may include forming a p-type semiconductor layer 206*a* on the first surface 204*a*. In operation 2506 the method 2500 may include forming a n-type semiconductor layer 206*b* on the second surface 204*b*. In operation 2508 the method 2500 may include forming a gate dielectric layer 118 in contact with the p-type semiconductor layer 206*a* and the n-type semiconductor layer 206*b*. In operation 2510 the method 2500 may include forming a first source electrode 110*a* and a first drain electrode 112*a* in contact with the p-type semiconductor layer 206*a*. In operation 2512 the method 2500 may include forming a second source electrode 110*b* and a second drain electrode 112*b* in contact with the n-type semiconductor layer 206*b*. In operation 2514 the method 2500 may include forming a gate electrode 116 in contact with the gate dielectric layer 118.

The method 2500 may further including configuring the semiconductor circuit 200 as an inverter circuit (200, 200*c*) by performing operations including electrically connecting the first source electrode 110*a* to a voltage supply 208 and connecting the second source electrode 110*b* to a ground voltage terminal 210, electrically connecting the gate electrode 116 to an input signal terminal 212, and electrically connecting the first drain electrode 112*a* and the second drain electrode 112*b* to an output signal terminal 214. The method 2500 may further include forming the n-type semiconductor layer 206*b* to include one or more of amorphous silicon, $Al_2O_5Zn_2$ doped ZnO, InGaZnO, InGaO, InWO, InZnO, InSnO, $Ga_2O_3$, ZnO, GaO, $Ga_2O_3$, InO, $In_2O_3$, InZnO, ZnO, TiOx, and alloys thereof.

The method 2500 may further include forming the p-type semiconductor layer 206*a* to include one or more of NiO, SnO, and $Cu_2O$. The method 2500 may further include forming the gate dielectric layer 118 to include one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina. The method 2500 may further include forming the electrically insulating structure 202 to include one or more of AlOx, SiO2, and SiNx. The method 2500 may further include forming one or more of the first source electrode 110*a*, the first drain electrode 112*a*, the second source electrode 110*b*, the second drain electrode 112*b* to include one or more of TiN, W, WN, WCN, Co, PdCo, Mo, Cu, TaN, Ti, and Al.

Referring to all drawings and according to various embodiments of the present disclosure, an inverter circuit (200, 200*c*) is provided. The inverter circuit (200, 200*c*) may include an electrically insulating structure 202 having a slab geometry including a first surface 204*a* and a second surface 204*b* that are parallel to one another and that are each oriented in respective planes that are perpendicular to a thickness direction (e.g., the x direction in FIGS. 2A, 2B, 13A, and 13B). The inverter circuit (200, 200*c*) may further include a p-type semiconductor layer 206*a* formed on the first surface 204*a*, an n-type semiconductor layer 206*b* formed on the second surface 204*b*, and a gate dielectric layer 118 formed in contact with the p-type semiconductor layer 206*a* and the n-type semiconductor layer 206*b*. The inverter circuit (200, 200*c*) may further include a gate electrode 116 formed in contact with the gate dielectric layer 118, a first source electrode 110*a* and a first drain electrode 112*a* formed in contact with the p-type semiconductor layer 206*a*, and a second source electrode 110*b* and a second drain electrode 112*b* formed in contact with the n-type semiconductor layer 206*b*. The first source electrode 110*a* may be electrically connected to a voltage supply 208 and the second source electrode 110*b* may be connected to a ground voltage terminal 210. The gate electrode 116 may be connected to an input signal terminal 212, and the first drain electrode 112*a* and the second drain electrode 112*b* may be electrically connected to an output signal terminal 214.

According to various embodiments, the electrically insulating structure 202 may be formed over an interlayer dielectric layer (150, 202L, 302) having a horizontal interface (e.g., see FIGS. 1 and 24A to 24C), and the electrically insulating structure 202 may have a vertical orientation such that each of the first surface 204*a* and the second surface 204*b* is perpendicular to the horizontal interface of the interlayer dielectric layer (150, 202L, 302). According to various embodiments, the interlayer dielectric layer (150, 202L, 302) may further include one or more electrical interconnect structures (142, 144, 146, 148), and one or more of the first source electrode 110*a*, the first drain electrode 112*a*, the second source electrode 110*b*, the second drain electrode 112*b*, and the gate electrode 116 may be electrically connected to the one or more electrical interconnect structures (142, 144, 146, 148). In some embodiments, one or both of the p-type semiconductor layer 206*a* and the n-type semiconductor layer 206*b* include metal-oxide semiconductors. For example, one or more of the n-type semiconductor layer 206*b* and the p-type semiconductor layer 206*a* may include a metal-oxide semiconductor including a multi-layer structure. In further embodiments, the n-type semiconductor layer 206*b* may include an alloy including, oxygen, a group-III element, and a group-V element.

In certain embodiments, the n-type semiconductor layer 206*b* may include one or more of amorphous silicon, $Al_2O_5Zn_2$ doped ZnO, InGaZnO, InGaO, InWO, InZnO, InSnO, $Ga_2O_3$, ZnO, GaO, $Ga_2O_3$, InO, $In_2O_3$, InZnO, ZnO, TiOx, and alloys thereof. In other embodiments, the n-type semiconductor layer 206*b* may include a composition given by Inx Gay Znz MO, wherein $0<x<1$; $0<y\leq 1$; $0<z<1$; and M is one of Ti, Al, Ag, Ce, and Sn. The p-type semiconductor layer 206*a* may include one or more of NiO, SnO, and $Cu_2O$. Other p-type metal-oxide semiconductors may also be used in other embodiments. The gate dielectric layer 118 may include one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina, in various embodiments, and the electrically insulating structure 202 may include one or more of AlOx, SiO2, SiNx, or other electrically insulating materials.

In some embodiments, one or more of the first source electrode 110*a*, the first drain electrode 112*a*, the second source electrode 110*b*, the second drain electrode 112*b* include one or more of TiN, W, WN, WCN, Co, PdCo, Mo, Cu, TaN, Ti, and Al. In other embodiments, one or more of the first source electrode 110*a*, the first drain electrode 112*a*, the second source electrode 110*b*, the second drain electrode 112*b* further include one or more alloys of one or more of W, Mo, Co, Pd, Ti, and mixtures thereof, with or without N and/or O, deposited by chemical vapor deposition or by atomic layer deposition.

According to other embodiments, a semiconductor circuit 200 is provided. The semiconductor circuit 200 may include a first layer of a p-type metal-oxide semiconductor 206*a* formed along a first vertical plane within an interlayer dielectric layer (150, 202L, 302) relative to a horizontal interface of the interlayer dielectric layer (150, 202L, 302) and a second layer of an n-type metal-oxide semiconductor 206*b* formed along a second vertical plane within the interlayer dielectric layer (150, 202L, 302) relative to the horizontal interface of the interlayer dielectric layer (150, 202L, 302) such that the first layer and the second layer are parallel to one another and are separated from one another by a portion of the interlayer dielectric layer (150, 202L, 302) (e.g., see FIGS. 24A and 24C).

The semiconductor circuit 200 may further include a gate electrode 116 having a first vertical portion parallel to the first layer and a second vertical portion parallel to the second layer and a gate dielectric layer 118 separating the first vertical portion of the gate electrode 116 from the first layer and separating the second vertical portion of the gate electrode 116 from the second layer (e.g., see FIGS. 2A, 2B, and 24A to 24D). The semiconductor circuit 200 may further include a first source electrode 110*a* and a first drain electrode 112*a* formed in contact with the p-type metal-oxide semiconductor and a second source electrode 110*b* and a second drain electrode 112*b* formed in contact with the n-type metal-oxide semiconductor. In additional embodiments, the semiconductor circuit 200 may be configured as an inverter circuit (200, 200*c*) in which the first source electrode 110*a* is electrically connected to a voltage supply 208 and the second source electrode 110*b* is connected to a ground voltage terminal 210, the gate electrode 116 is electrically connected to an input signal terminal 212, and the first drain electrode 112*a* and the second drain electrode 112*b* are electrically connected to an output signal terminal 214 (e.g., see FIGS. 2B and 2C).

According to various embodiments, the n-type metal-oxide semiconductor may include one or more of amorphous silicon, $Al_2O_5Zn_2$ doped ZnO, InGaZnO, InGaO, InWO, InZnO, InSnO, $Ga_2O_3$, ZnO, GaO, $Ga_2O_3$, InO, $In_2O_3$, InZnO, ZnO, TiOx, and alloys thereof, and the p-type metal-oxide semiconductor includes one or more of NiO, SnO, and $Cu_2O$. In further embodiments, the gate dielectric layer 118 may include one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina. Further, according to some embodiments, one or more of the first source electrode 110*a*, the first drain electrode 112*a*, the second source electrode 110*b*, the second drain electrode 112*b* may include one or more of TiN, W, WN, WCN, Co, PdCo, Mo, Cu, TaN, Ti, Al, and alloys of one or more of W, Mo, Co, Pd, Ti, and mixtures thereof, with or without N and/or O.

The above-described embodiments provide semiconductor circuits (200, 200*c*) and methods that may be advantageous in terms of manufacturing flexibility, reduced size, and reduced short channel effects. In this regard, an embodiment semiconductor circuit (e.g., a CMOS inverter (200, 200*c*)) is provided that may be formed in a BEOL process and may be incorporated with other BEOL circuit components such as capacitors, inductors, resistors, and integrated passive devices. As such, the disclosed semiconductor circuit (200, 200*c*) may include materials that may be processed at low temperatures and thus, may not damage previously fabricated devices (e.g., FEOL and MEOL devices). Further, the embodiment semiconductor circuit may include a p-channel metal oxide semiconductor field effect transistor (pFET) 216 having a vertical channel layer 206*a* and an n-channel metal oxide semiconductor field effect transistor (nFET) 218 also having a vertical channel layer 206*b*. Each of the vertical p-channel 206*a* and the vertical n-channel 206*b* may be formed on opposite sides of a vertically-oriented electrically insulating structure 202 such that the vertical p-channel 206*a* and the vertical n-channel 206*b* are closely spaced relative to one another. The use of such vertical channels (206*a*, 206*b*) may provide a semiconductor circuit (200, 200*c*) having a reduced size relative to alternative structures that do not include vertical channels (206*a*, 206*b*) and may allow longer channel lengths without increased device size, which may mitigate short-channel effects.

The foregoing outlines features of several embodiments so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure.

What is claimed is:

1. A method of forming a semiconductor circuit, comprising:

forming an electrically insulating structure having an etch-stop layer thereon and a slab geometry comprising a first surface and a second surface that are parallel to one another and that are each oriented in respective planes that are perpendicular to a thickness direction, wherein the electrically insulating structure has a main thickness;

forming a p-type semiconductor layer with a first thickness on the first surface;

forming a n-type semiconductor layer with a second thickness on the second surface, thereby forming a semiconductor slab structure with a third thickness, wherein the third thickness includes the main thickness, the first thickness, and the second thickness;

forming a gate dielectric layer on the semiconductor slab structure in contact with the p-type semiconductor layer and the n-type semiconductor layer;

forming a first source electrode and a first drain electrode in contact with the p-type semiconductor layer;

forming a second source electrode and a second drain electrode in contact with the n-type semiconductor layer; and forming a gate electrode in contact with the gate dielectric layer.

2. The method of claim 1, further comprising configuring the semiconductor circuit as an inverter circuit by performing operations comprising:

electrically connecting the first source electrode to a voltage supply and the second source electrode to a ground voltage terminal;

electrically connecting the gate electrode to an input signal terminal; and electrically connecting the first drain electrode and the second drain electrode to an output signal terminal.

3. The method of claim 1, further comprising:

forming the n-type semiconductor layer to comprise at least one of amorphous silicon, $Al_2O_5Zn_2$ doped ZnO, InGaZnO, InGaO, InWO, InSnO, GaO, $Ga_2O_3$, InO, $In_2O_3$, InZnO, ZnO, TiOx, and alloys thereof;

forming the p-type semiconductor layer to comprise at least one of NiO, SnO, and $Cu_2O$;

forming the gate dielectric layer to comprise at least one of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, and hafnium dioxide-alumina;

forming the electrically insulating structure to comprise at least one of AlOx, SiO2, and SiNx; and forming one or more of the first source electrode, the first drain electrode, the second source electrode, the second drain electrode to comprise one or more of TiN, W, WN, WCN, Co, PdCo, Mo, Cu, TaN, Ti, and Al.

4. A method of forming an inverter circuit, comprising:

forming a first interlayer dielectric layer over a substrate;

forming an etch-stop layer over the first interlayer dielectric layer;

forming an electrically insulating structure having a slab geometry over the first interlayer dielectric layer, the electrically insulating structure comprising a first surface and a second surface that are parallel to one another and that are each oriented in respective planes that are perpendicular to a thickness direction, wherein the etch stop layer covers a top portion of the electrically insulating structure;

forming a p-type semiconductor layer on the first surface of the electrically insulating structure;

forming an n-type semiconductor layer on the second surface of the electrically insulating structure;

forming a gate dielectric layer in contact with the p-type semiconductor layer and the n-type semiconductor layer; and forming a gate electrode in contact with the gate dielectric layer, wherein the etch-stop layer is positioned between the n-type semiconductor layer and the p-type semiconductor layer.

5. The method of claim 4, wherein forming the electrically insulating structure comprises:

depositing a second interlayer dielectric material layer over the first interlayer dielectric;

forming a patterned photoresist over the second interlayer dielectric material layer; and performing an anisotropic etch process to remove portions of the second interlayer dielectric material layer not masked by the patterned photoresist.

6. The method of claim 4, wherein the etch-stop layer comprises one or more of silicon nitride, silicon carbide, silicon nitride carbide, aluminum oxide, titanium oxide, and tantalum oxide.

7. The method of claim 4, wherein forming the p-type semiconductor layer comprises masking a part of the p-type semiconductor layer and removing an unmasked part of the p-type semiconductor.

8. The method of claim 4, wherein forming the n-type semiconductor layer comprises masking a part of the n-type semiconductor layer and removing an unmasked part of the n-type semiconductor.

9. The method of claim 4, further comprising annealing the p-type semiconductor layer at a temperature in a range from 200° C. to 400° C.

10. The method of claim 4, further comprising annealing the n-type semiconductor layer at a temperature in a range from 200° C. to 400° C.

11. The method of claim 4, wherein the gate electrode has a vertical orientation such that the gate electrode extends along both the first surface and the second surface of the electrically insulating structure.

12. The method of claim 4, wherein forming the gate electrode comprises:

depositing a conductive material over the gate dielectric layer;

forming a patterned photoresist over the conductive material; and performing an anisotropic etch process to remove portions of the conductive material not masked by the patterned photoresist.

13. The method of claim 4, wherein the gate electrode comprises a metallic liner material and a metallic fill material.

14. A method of fabricating a semiconductor device, comprising:

providing a substrate having one or more lower-level metal interconnect structures;

depositing a first interlayer dielectric material layer over the substrate;

forming an etch-stop layer on the first interlayer dielectric material;

patterning the first interlayer dielectric material layer to form an electrically insulating structure having a slab geometry with a first surface and a second surface that are parallel to one another, wherein the etch-stop layer covers a top portion of the electrically insulating structure;

depositing a p-type metal-oxide semiconductor layer on the first surface;

depositing an n-type metal-oxide semiconductor layer on the second surface;

depositing a gate dielectric layer over the p-type metal-oxide semiconductor layer and the n-type metal-oxide semiconductor layer;

depositing a gate electrode over the gate dielectric layer, wherein the gate electrode is in contact with the gate dielectric layer;

forming a first source electrode and a first drain electrode in contact with the p-type metal-oxide semiconductor layer; and forming a second source electrode and a second drain electrode in contact with the n-type metal-oxide semiconductor layer, wherein the etch-stop layer is positioned between the n-type metal-oxide semiconductor layer and the p-type metal-oxide semiconductor layer.

15. The method of claim 14, wherein the electrically insulating structure has a vertical orientation such that each of the first surface and the second surface is perpendicular to a horizontal interface of the substrate.

16. The method of claim 14, further comprising:

forming trenches in a second interlayer dielectric material layer adjacent to the p-type metal-oxide semiconductor layer and the n-type metal-oxide semiconductor layer; and filling the trenches with a conductive material to form the first source electrode, the first drain electrode, the second source electrode, and the second drain electrode.

17. The method of claim 14, wherein the gate dielectric layer comprises a high-k dielectric material having a dielectric constant greater than 3.9.

18. The method of claim 14, wherein the p-type metal-oxide semiconductor layer has a thickness in a range from 2 nm to 50 nm.

19. The method of claim 14, wherein the n-type metal-oxide semiconductor layer has a thickness in a range from 2 nm to 50 nm.

20. The method of claim 14, further comprising:

electrically connecting the first source electrode to a voltage supply;

electrically connecting the second source electrode to a ground voltage terminal;

electrically connecting the gate electrode to an input signal terminal; and electrically connecting the first drain electrode and the second drain electrode to an output signal terminal to configure the semiconductor device as an inverter circuit.

* * * * *